(12) United States Patent
Ayothi et al.

(10) Patent No.: US 9,772,558 B2
(45) Date of Patent: Sep. 26, 2017

(54) SULFONIC ACID ESTER CONTAINING POLYMERS FOR ORGANIC SOLVENT BASED DUAL-TONE PHOTORESISTS

(71) Applicants: International Business Machines Corporation, Armonk, NY (US); JSR Corporation, Tokyo (JP)

(72) Inventors: Ramakrishnan Ayothi, San Jose, CA (US); Sally A. Swanson, San Jose, CA (US); Gregory M. Wallraff, San Jose, CA (US)

(73) Assignees: International Business Machines Corporation, Armonk, NY (US); JSR Corporation, Tokyo (JP)

( * ) Notice: Subject to any disclaimer, the term of this patent is extended or adjusted under 35 U.S.C. 154(b) by 78 days.

(21) Appl. No.: 14/035,891

(22) Filed: Sep. 24, 2013

(65) Prior Publication Data

US 2015/0086925 A1   Mar. 26, 2015

(51) Int. Cl.
| | | |
|---|---|---|
| *G03F 7/32* | (2006.01) | |
| *G03F 7/20* | (2006.01) | |
| *G03F 7/40* | (2006.01) | |
| *G03F 7/004* | (2006.01) | |

(Continued)

(52) U.S. Cl.
CPC ............ *G03F 7/325* (2013.01); *G03F 7/0045* (2013.01); *G03F 7/0046* (2013.01); *G03F 7/0048* (2013.01); *G03F 7/0382* (2013.01); *G03F 7/0392* (2013.01); *G03F 7/0397* (2013.01); *G03F 7/2037* (2013.01); *G03F 7/2041* (2013.01); *G03F 7/40* (2013.01)

(58) Field of Classification Search
None
See application file for complete search history.

(56) References Cited

U.S. PATENT DOCUMENTS

| | | |
|---|---|---|
| 6,136,499 A | 10/2000 | Goodall et al. |
| 6,451,499 B1 | 9/2002 | Jayaraman et al. |
| 6,576,392 B1 | 6/2003 | Sato et al. |

(Continued)

FOREIGN PATENT DOCUMENTS

| | | |
|---|---|---|
| JP | 2000231194 A | 8/2000 |
| JP | 2000330289 A | 11/2000 |

(Continued)

OTHER PUBLICATIONS

JPO English abstract for JP2011-150211 (2011).*

(Continued)

*Primary Examiner* — Sin Lee
(74) *Attorney, Agent, or Firm* — Karen Canaan; CanaanLaw, P.C.

(57) ABSTRACT

Provided are chemically amplified resist compositions that include acid-labile sulfonate-ester photoresist polymers that are developable in an organic solvent. The chemically amplified resists produce high resolution positive tone development (PTD) and negative tone development (NTD) images depending on the selection of organic development solvent. Furthermore, the dissolution contrast of the traditional chemically amplified resists may be optimized for dual tone imaging through the addition of a photoresist polymer comprising an acid-labile sulfonate-ester moiety.

27 Claims, 19 Drawing Sheets

(51) Int. Cl.
*G03F 7/039* (2006.01)
*G03F 7/038* (2006.01)

(56) References Cited

U.S. PATENT DOCUMENTS

| | | | |
|---|---|---|---|
| 7,147,983 | B1 | 12/2006 | Mori et al. |
| 7,371,499 | B2 | 5/2008 | Noh et al. |
| 7,851,140 | B2 | 12/2010 | Tsubaki |
| 2004/0157156 | A1* | 8/2004 | Harada ............... C07C 309/67 430/270.1 |
| 2008/0187860 | A1* | 8/2008 | Tsubaki et al. ............ 430/270.1 |
| 2011/0159429 | A1 | 6/2011 | Thackeray et al. |
| 2011/0207052 | A1 | 8/2011 | Sanders et al. |
| 2012/0149921 | A1 | 6/2012 | Fukumoto et al. |
| 2012/0208131 | A1* | 8/2012 | Hirano et al. ................ 430/326 |
| 2012/0214099 | A1 | 8/2012 | Chen et al. |
| 2013/0017492 | A1 | 1/2013 | Hatakeyama |
| 2013/0022914 | A1 | 1/2013 | Tanaka et al. |

FOREIGN PATENT DOCUMENTS

| | | | |
|---|---|---|---|
| JP | 2001081138 A | | 3/2001 |
| JP | 2004244436 A | | 9/2004 |
| JP | 2011-150211 | * | 8/2011 |
| JP | 2013083966 A | | 5/2013 |
| JP | 2014089404 A | | 5/2014 |
| JP | 2014178478 A | | 9/2014 |
| KR | 1020000047927 A | | 7/2000 |
| WO | 2003025675 A1 | | 3/2003 |
| WO | 2012098952 A1 | | 7/2012 |

OTHER PUBLICATIONS

Machine-assisted Egnlish translation for JP2011-150211, as provided by JPO (2011).*

Hosoi et al., Sythesis of Stable Acid Amplifiers that Produce Strong, Highly Fluorinated Polymer Bound Acid, Advances in Resist Materials and Processing Technology XXIX, Mark H. Somervell & Thomas I. Wallow (Eds), Proc. of SPIE 8325:83251S-1 to 83251S-7 (2012).

Mehta et al., Assessment of Negative Tone Development Challenges, Advances in Resist Materials and Processing Technology XXIX, Mark H. Somervell & Thomas I. Wallow (Eds), Proc. of SPIE 8325:832506-1 to 832506-15 (2012).

Park et al., Polymers with Acid-Amplifying Side Chains as Positive-Type Photoresists, J. Photopolymer Sci. & Tech. 17(3):427-432 (2004).

International Search Report and Written Opinion dated Oct. 28, 2015 for counterpart PCT Application No. PCT/JP2014/003888.

International Preliminary Report on Patentability for PCT Application PCT/JP2014/003888 dated Apr. 7, 2016.

* cited by examiner

SULFONIC ACID ESTER CONTAINING POLYMERS FOR ORGANIC SOLVENT BASED DUAL-TONE PHOTORESISTS

JOINT RESEARCH AGREEMENT

The invention described herein is subject to a joint research agreement between International Business Machines Corporation and JSR Corporation.

TECHNICAL FIELD

The present invention relates generally to photoresist compositions. More specifically, the present invention relates to acid-labile sulfonate-ester containing photoresist polymers that upon development in an organic solvent produce positive or negative tone images (dual-tone imaging) depending on the selection of development solvent.

BACKGROUND OF THE INVENTION

Over the past three decades, positive tone chemically amplified (CA) photoresists developed with aqueous base have been the industry standard for advanced semiconductor manufacturing. Recently, there has been a switch to negative tone resists developed in organic solvent due to their superior performance in certain lithographic processes. Typically the same CA resists are used for both positive tone aqueous solvent developed resists and negative tone organic solvent developed resists. Because the CA resists have not been optimized for organic solvent development, they can suffer performance limitations when used as negative tone organic solvent developed resists, particularly with respect to unwanted resist thinning and loss of contrast. In view of the foregoing, there is a need in the art for a method to improve the performance of conventional CA resists such that the CA resists are more compatible with organic solvent negative tone development. An additional advantage would be found in the art if the improved organic solvent developable CA resist could be processed as both negative tone and positive tone resists.

SUMMARY OF THE INVENTION

The present invention provides improvements to currently used CA photoresists by maintaining the CA formulations largely unchanged while incorporating performance enhancing acid-labile sulfonate ester moieties (or units) on the polymer main chain of the standard photoresist polymer at low levels. The incorporation of low levels of acid-labile sulfonate ester moieties to the standard photoresist polymer improves the performance of the CA resists such that the resists can be processed in organic solvents as both positive and negative tone resists.

In one embodiment of the invention, there is provided a method comprising preparing a chemically amplified photoresist composition comprising: an organic solvent developable photoresist polymer, the polymer comprising an acid-labile sulfonate-ester moiety in the range of 1-50 wt %. The chemically amplified photoresist may be developed with an organic solvent to produce a positive tone or negative tone image in a photoresist film.

In another embodiment of the invention, there is provided a method comprising the steps of: (a) preparing a chemically amplified photoresist composition comprising an organic acid developable photoresist polymer comprising an acid-labile sulfonate-ester moiety in the range of 1-50 wt %, a casting solvent, and optionally a photoacid generator (PAG); (b) applying the resist composition of step (a) to a substrate to form a resist film; (c) optionally, baking the resist film (PAB); (d) exposing the resist film to radiation; (e) optionally, baking the resist film (PEB); (f) developing the resist film with an organic solvent to expose a pattern etched onto the resist film; and (g) optionally rinsing the resist film with water or an organic solvent.

In a further embodiment, the photoresist polymer comprises a poly(hydroxystyrene). In this embodiment, the acid-labile sulfonate-ester moiety may be present in the poly(hydroxystyrene) photoresist polymer in a range of 5-10 wt %.

In another embodiment, the photoresist polymer comprises a lactone-based polymer. In this embodiment, the acid-labile sulfonate-ester moiety is preferably present in the lactone-based photoresist polymer in a range of 5-31 wt %.

In a further embodiment, the photoresist polymer is substantially lactone-free. In this embodiment, the acid-labile sulfonate-ester moiety is preferably present in the substantially lactone-free photoresist polymer in a range of 5-31 wt %.

In another embodiment, the photoresist polymer is blended with an additional polymer that is free of an acid-labile sulfonate-ester moiety. In this embodiment, the blended polymer combination enhances dissolution contrast of the photoresist.

In a further embodiment, the casting solvent of step (a) is selected from the group consisting of propylene glycol methyl ether acetate (PGMEA), cyclohexanone (CHYN), and a combination of PGMEA and CHYN.

In another embodiment, the PAG of step (a) is triphenylsulfonium perfluoro-1-butanesulfonate (TPS-N).

In a further embodiment, the radiation of step (d) is selected from the group consisting of deep ultraviolet (DUV) radiation, extreme ultraviolet (EUV) radiation, electron beam (e-beam) radiation, and ion-beam radiation.

In another embodiment, the resist film of step (f) is developed with a positive tone development (PTD) organic solvent to produce a positive tone image on the resist film.

In a further embodiment, the PTD organic solvent comprises a polyhydric alcohol-based organic solvent.

In another embodiment, the polyhydric alcohol-based organic solvent is selected from ethylene glycol and ethylene glycol combined with isopropyl alcohol.

In a further embodiment, the resist film of step (f) is developed with a negative tone development (NTD) organic solvent to produce a negative tone image on the resist film.

In another embodiment, the NTD organic solvent is selected from the group consisting of a methyl amyl ketone (MAK), n-butyl acetate (nBA), n-pentylacetate (nPA), ethyl amyl ketone (EAK), and combinations thereof.

In a further embodiment, the resist film of step (f) is a positive tone resist film and is rinsed at step (g) with water.

In another embodiment, the resist film of step (f) is a negative tone resist film and is rinsed at step (g) with an organic solvent.

In a further embodiment, the resist polymer composition of step (a) further includes a quencher selected from the group consisting of base quenchers and radiation sensitive quenchers.

In another embodiment, the radiation sensitive quencher is a photodecomposable base (PDB).

In a further embodiment, the PBD is triphenylsulfonium heptafluorobutyrate (TPS-HFB).

Additional aspects and embodiments of the invention will be provided, without limitation, in the detailed description of the invention that is set forth below.

BRIEF DESCRIPTION OF THE DRAWINGS

FIG. 4($a$) shows KrF positive tone imaging results for 190 nm line and space (LS) patterns at 35 mJ/cm$^2$; FIG. 4($b$) shows KrF negative tone imaging results for 190 nm LS patterns at 37 mJ/cm$^2$; FIG. 4($c$) shows EUV positive tone imaging results of 30 nm LS patterns at 19 mJ/cm$^2$; and FIG. 4($d$) shows EUV negative tone imaging results of 30 nm LS patterns at 22 mJ/cm$^2$.

FIG. 5($a$) shows KrF positive tone imaging results of 160 nm LS patterns at 35 mJ/cm$^2$; FIG. 5($b$) shows KrF positive tone imaging results of 200 nm LS patterns at 35 mJ/cm$^2$; FIG. 5($c$) shows KrF negative tone imaging results of 160 nm LS patterns at 40 mJ/cm$^2$; and FIG. 5($d$) shows KrF negative tone imaging results of 200 nm LS patterns at 40 mJ/cm$^2$.

FIG. 6($a$) shows KrF positive tone imaging results of 160 nm LS patterns at 32 mJ/cm$^2$; FIG. 6($b$) shows KrF positive tone imaging results of 200 nm LS patterns at 32 mJ/cm$^2$; FIG. 6($c$) shows KrF negative tone imaging results of 160 nm LS patterns at 37 mJ/cm$^2$; and FIG. 6($d$) shows KrF negative tone imaging results of 200 nm LS patterns at 37 mJ/cm$^2$.

FIG. 10($b$) is a KrF contrast curve graph for the same photoresist with an acid-labile sulfonate-ester group, NBHFAMA-ECpMA-PStS.

FIG. 12($b$) is a KrF contrast curve graph for the same photoresist with an acid-labile sulfonate-ester group, NM-ECpMA/NBHFAMA-ECpMA-PStS (25:75) blend.

FIG. 13($b$) is a KrF contrast curve graph for the same photoresist with an acid-labile sulfonate-ester group, NM-Hd-ECpMA/NBHFAMA-ECpMA-PStS (25:75).

DETAILED DESCRIPTION OF THE INVENTION

Set forth below is a description of what are currently believed to be preferred embodiments of the claimed invention. Any alternates or modifications in function, purpose, or structure are intended to be covered by the claims of this application. As used in this specification and the appended claims, the singular forms "a," "an," and "the" include plural referents unless the context clearly dictates otherwise. The terms "comprises" and/or "comprising," as used in this specification and the appended claims, specify the presence of stated features, integers, steps, operations, elements, and/or components, but do not preclude the presence or addition of one or more other features, integers, steps, operations, elements, components, and/or groups thereof.

As used herein, the terms "resist" and "photoresist" are meant to refer to the same composition and thus, the terms are used interchangeably herein.

The term "chemically amplified resist" is used in its traditional sense to refer to a photoresist that is based on acid-catalyzed deprotection and is comprised of a polymer, catalyst, additive, and casting solvent. Chemically amplified resists are designed for DUV and shorter wavelengths and have increased sensitivity to exposure energy as a consequence of the chemical amplification.

The term "negative tone resist" refers to a photoresist that upon development produces a negative tone image (where unexposed regions are removed during the development process).

The term "positive tone resist" refers to a photoresist that upon development produces a positive tone image (where exposed regions are removed during the development process).

The term "PStS" appended to the end of the chemical names used herein refers to an acid-labile pinanyl styrene sulfonate-ester moiety, which is typically incorporated into the main chain of a polymer.

The term "acid-labile" is used in its traditional sense to refer to moieties that react with acid and are converted into functionality with different chemical properties Within the context of the present invention, resist polymers and/or resists that do not contain acid-labile sulfonate-esters (PStS) are referred to herein interchangeably as "standard," "traditional," or "conventional" resist polymers and/or resists.

Figure 1:
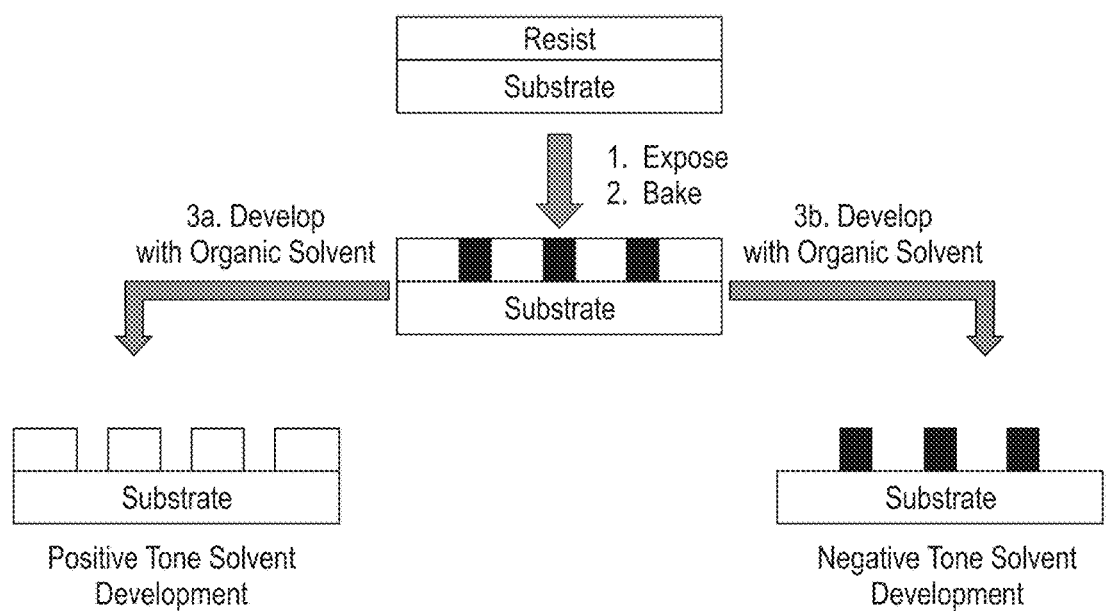
FIG. 1 is a schematic of organic solvent based positive and negative tone (dual-tone) imaging.

The terms "positive tone development" and "PTD," which are used interchangeably throughout, refer to a method by which exposure of a photoresist with a light source, typically followed by post exposure bake, changes the composition of the resist such that the exposed portions of the resist become more soluble in the positive tone developing solvent. When the resist is developed with this solvent, the exposed portions of the resist are washed away leaving a positive tone relief pattern in the resist film. Within the context of the present invention, the PTD solvent is an organic solvent. FIG. 1 provides a schematic of positive tone development.

The terms "negative tone development" and "NTD," which are used interchangeably throughout, refer to a lithography method by which exposure of the resist with a light source, typically followed by post-exposure bake, changes the composition of the resist making it more difficult to dissolve in the NTD solvent. When the resist is developed, only the unexposed portions of the resist wash away leaving a negative tone relief pattern etched in the resist. Within the context of the present invention, the NTD solvent is an organic solvent. FIG. 1 provides a schematic of negative tone development.

The term "dual-tone resist" refers to a photoresist which can be used to produce either positive tone or negative tone relief patterns depending on the choice of development solvent used. Typically, a single development step is used to produce a negative tone or positive tone film from a dual tone resist; this single step process is the standard lithographic procedure used in semiconductor manufacturing. A dual-tone resist can also be used in alternative "dual-tone development" processes in a sidewall based double patterning procedure. In this type of dual-tone development, the first development step uses PTD to remove high exposure dose areas and the subsequent development step uses NTD to remove the unexposed or lowest exposure dose areas. Dual-tone development of the resist film leaves the intermediate dose areas defining the two features edges intact. Within the context of the present invention, dual-tone development will be carried out with two different organic solvents, a PTD organic solvent and a NTD organic solvent.

The term "polyhydric alcohol" is used in its traditional sense to refer to an alcohol molecule that has more than one hydroxyl group.

The term "DUV" or "deep ultraviolet" refers to radiation at wavelengths of 300 nm or shorter, with typical DUV exposure wavelengths for lithography techniques being 248 nm (5 eV) with krypton fluoride (KrF) excimer lasers and 193 nm (6.4 eV) with argon fluoride (ArF) excimer lasers.

The term "EUV" or "extreme ultraviolet" refers to radiation at wavelengths of 50 nm or shorter. Typical EUV exposure currently occurs at 10 to 13 nm with 13.5 nm being the most commonly used EUV wavelength.

The present invention provides a method for improving the performance of organic solvent developable CA resists by covalently attaching acid-labile sulfonic acid esters, to conventional photoresist polymers. Upon image-wise exposure and post exposure bake, the moieties generate highly polar polymer bound sulfonic acids that improve the dissolution contrast of the resist thereby improving performance of the CA resists in organic solvent developers.

The CA resists of the present invention are based on polymers that incorporate between 1 and 50 wt % acid-labile sulfonate-esters. The resists are designed for optimum performance when developed in organic solvents (i.e., non-aqueous solvents) and can be used in KrF, ArF, EUV and e-beam high resolution lithographic processes. Inclusion of only a few wt % of acid-labile sulfonate to the CA resists can result in dramatic improvements in the contrast and resolution of the resists over traditional CA resists that are developed in organic solvents. In this way, the present invention provides a simple and cost-effective way to improve the performance of existing resist systems and is compatible with a number of different resist chemistries. In addition, resists based on the method described herein can be used in either positive or negative tone solvent development, an advantage over most current state of the art CA resists.

The general process of positive tone and negative tone (i.e., dual tone) organic solvent development of CA resists is illustrated in FIG. 1. With organic solvent development of conventional positive tone CA resists, dissolution contrast is due to polarity differences between the exposed and unexposed regions of the resist film. This is true for both positive tone and negative tone solvent development. By contrast, when conventional positive tone resists are developed in aqueous base, the dissolution contract is due to differences in the acidity of the exposed regions and unexposed regions of the resist film. As shown in FIG. 1, the properties of the solvent determine the tone of the resist.

With respect to FIG. 1, the organic solvent NTD development method shown therein is distinct from the dissolution contrast that derives from changes in polymer molecular weight in other negative tone resist processes based on chemically amplified crosslinking reactions. With regard to dissolution contrast, the methods described herein apply to CA resist polymers containing acid-labile sulfonate-esters, which improve the dissolution contrast of the resists over that seen with traditional CA resists that are developed in organic solvents. With the methods described herein, the exposed and baked regions of the resist film have enhanced polarity as a result of the presence of the newly generated sulfonic acid moiety, whereas the unexposed regions of the film remain relatively non-polar and may have a degree of dissolution inhibition due to the presence of the sulfonate-ester moiety. The attributes of enhanced polarity of exposed regions and dissolution inhibition of unexposed regions are what give the sulfonate-ester based resists described herein their improved performance.

Figure 2:
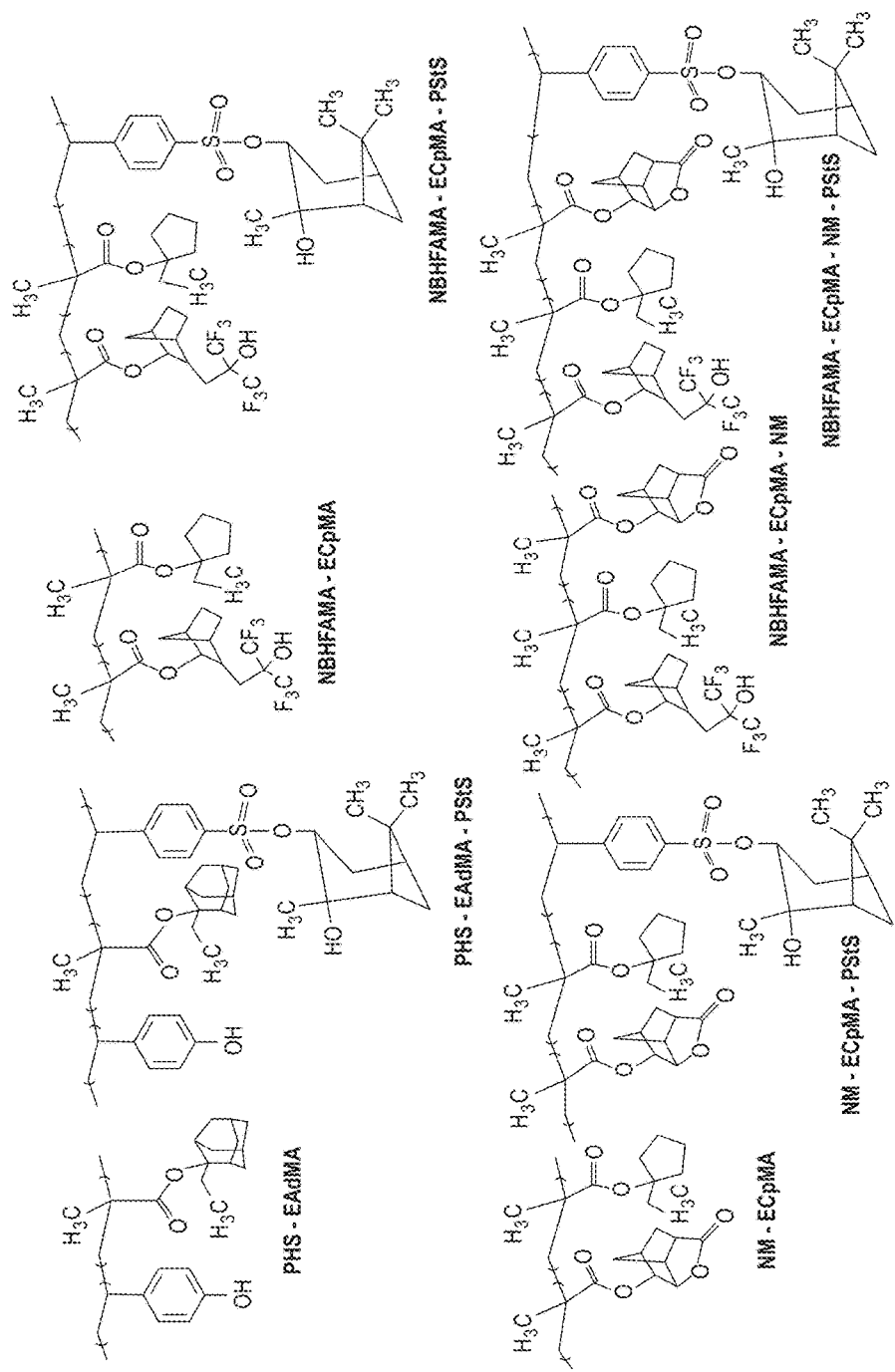
FIG. 2 shows chemical structures of the photoresist polymers PHS-EAdMA; NBHFAMA-ECpMA; NM-ECpMA; and NBHFAMA-ECpMA-NM, and the same photoresist polymers with acid-labile sulfonate-ester groups: PHS-EAdMA-PStS; NBHFAMA-ECpMA-PStS; NM-ECpMA-PStS; and NBHFAMA-ECpMA-NM-PStS.

FIG. 2 shows structural information for several CA resist polymers that are used in KrF, ArF, EUV, and e-beam lithography, both with and without the acid-labile sulfonate-ester moieties described herein. The polymers of FIG. 2 were formulated into resists according to the formulation details provided in Table 1 and according to the general resist polymer preparation procedure of Example 2.

TABLE 1

RESIST FORMULATIONS

| Resist Type | Resist | Polymer | PAG | Quencher | Solvent |
|---|---|---|---|---|---|
| PHS | PHS-EAdMA | PHS-EAdMA (100) | TPS N (0.25M) | TPS HFB (0.1M) | PGMEA |
|  | PHS-EAdMA-PStS | PHS-EAdMA-PStS (100) | TPS N (0.25M) | TPS HFB (0.1M) | PGMEA |
| Lactone | NM-ECpMA | NM-ECpMA (100) | TPS N (0.25M) | TPS HFB (0.1M) | PGMEA/CYHN |
|  | NM-ECpMA-PStS | NM-ECpMA-PStS (100) | TPS N (0.25M) | TPS HFB (0.1M) | PGMEA/CYHN |
|  | NBHFAMA-ECpMA-NM | NBHFAMA-ECpMA-NM (100) | TPS N (0.25M) | TPS HFB (0.1M) | PGMEA/CYHN |
|  | NBHFAMA-ECpMA-NM-PStS | NBHFAMA-ECpMA-NM-pStS (100) | TPS N (0.25M) | TPS HFB (0.1M) | PGMEA/CYHN |
| Lactone | NBHFAMA-ECpMA | NBHFAMA-ECpMA (100) | TPS N (0.25M) | TPS HFB (0.1M) | PGMEA |

TABLE 1-continued

RESIST FORMULATIONS

| Resist Type | Resist | Polymer | PAG | Quencher | Solvent |
|---|---|---|---|---|---|
| Free | NBHFAMA-ECpMA-PStS | WBHFAMA-ECpMA-PStS (100) | TPS N (0.25M) | TPS HFB (0.1M) | PGMEA |
| Blend | PHS-EAdMA/PHS-EAdMA-PStS | PHS-EAdMA/PHS-EAdMA-PStS (50:50) | TPS N (0.25M) | TPS HFB (0.1M) | PGMEA |
| | NBHFAMA-ECpMA/NM-ECpMA | NBHFAMA-ECpMA/NM-ECpMA (75:25) | TPS N (0.25M) | TPS HFB (0.1M) | PGMEA/CYHN |
| | NBHFAMA-ECpMA-PStS/NM-ECpMA | NBHFAMA-ECpMA-PStS/NM-ECpMA (75:25) | TPS N (0.25M) | TPS HFB (0.1M) | PGMEA/CYHN |
| | NBHFAMA-ECpMA/NM-Hd-ECpMA | NBHFAMA-ECpMA/NM-ECpMA-HdEMA (75:25) | TPS N (0.25M) | TPS HFB (0.1M) | PGMEA/CYHN |
| | NBHFAMA-ECpMA-PStS//NM-Hd-ECpMA | NBHFAMA-ECpMA-PStS//NM-ECpMA-HdEMA (75:25) | TPS N (0.25M) | TPS HFB (0.1M) | PGMEA/CYHN |

Figure 3:
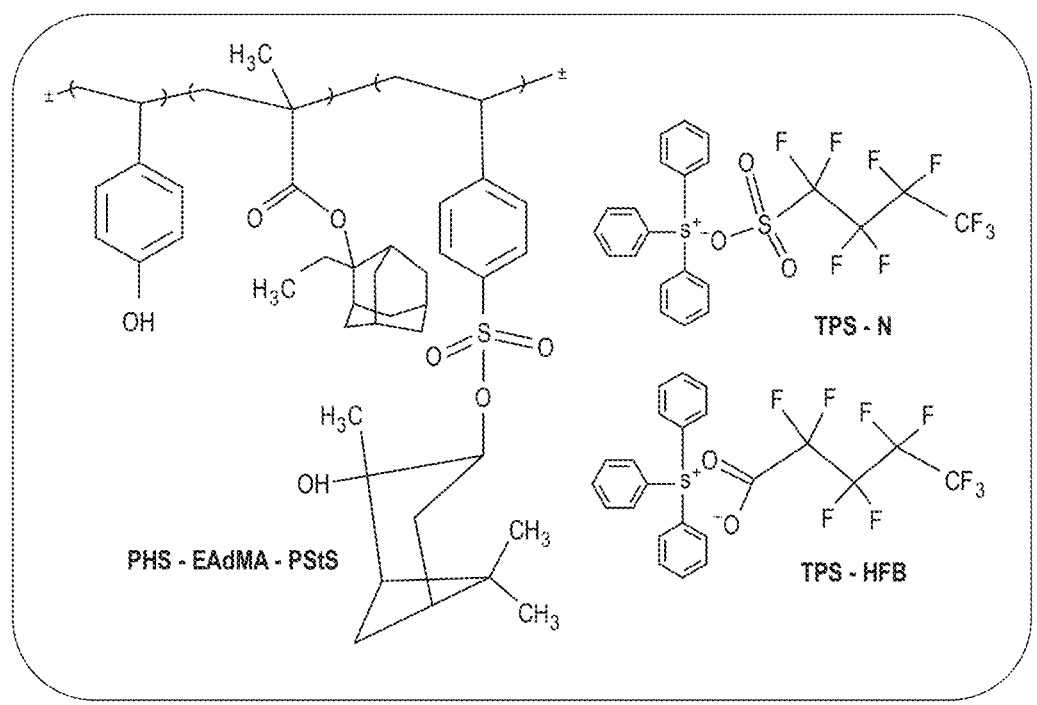
FIG. 3 is a representation of the chemical structure of the organic developable photoresist polymer PHS-EAdMA-PStS and of the resist additives TPS-N and TPS-HFB.

FIG. 3 shows the exemplary sulfonate-ester containing CA PHS (poly(hydroxystyrene)) resist polymer, PHS-EAdMA-PStS, which is produced by the incorporation of 5 wt % acid-labile sulfonate-ester into the standard PHS-EAdMA polymer. FIG. 3 also shows the structures of the TPS-N (PAG) and TPS-HFB (quencher) of Table 1, which are used to prepare the sulfonate-ester containing CA resists of the present invention.

FIGS. 4, 5, and 6 show high resolution positive tone and negative tone images for resists prepared from the following sulfonate-ester containing organic solvent developable resist polymers of the present invention: the PHS-based PHS-EAdMA-PStS resists (FIGS. 4(a)-4(d)); the lactone-based NBHFAMA-ECpMA-NM-PStS resists (FIGS. 5(a)-5(d); and lactone-free-based NBHFAMA-ECpMA-PStS resists (FIGS. 6(a)-6(d)).

Figure 4A:
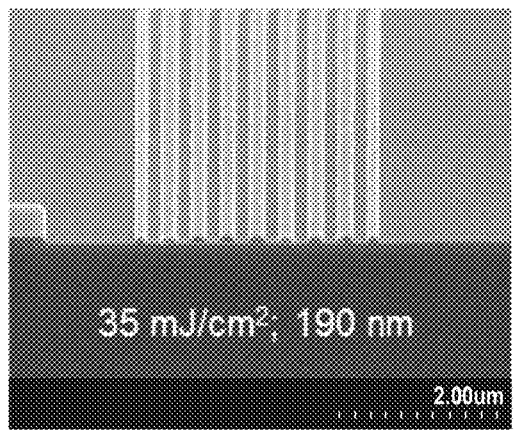
FIGS. 4($a$)-4($d$) are scanning electron microscopy (SEM) micrographs of imaging results for the PHS-EAdMA-PStS (PHS-EAdMA-PStS/TPSN/TPS HFB) resist of the present invention.
Figure 4B:
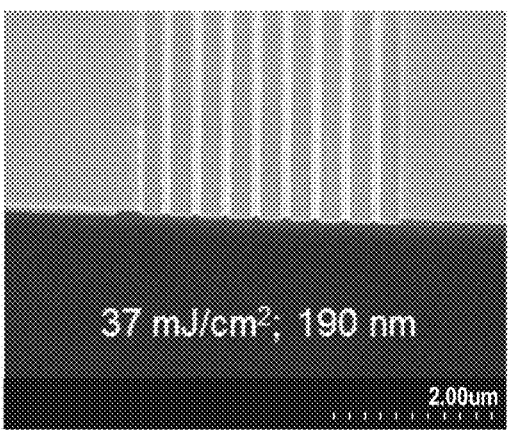
Figure 4C:
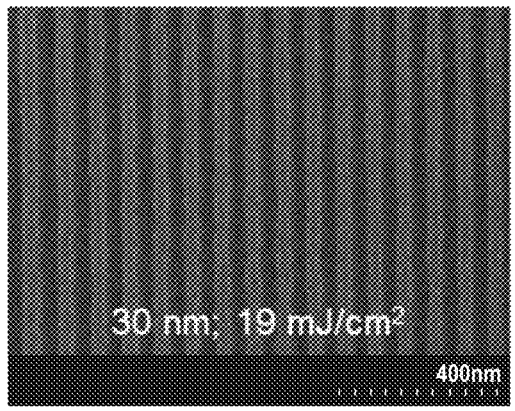
Figure 4D:
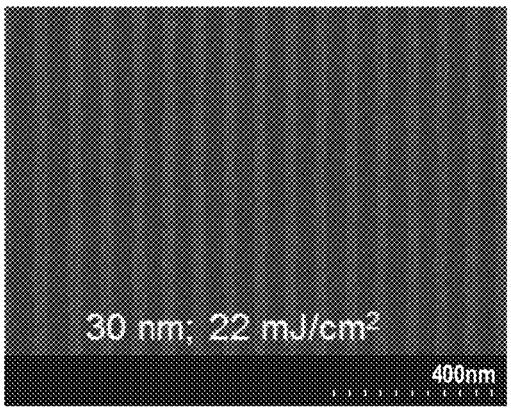

FIG. 4(a) shows an image of a KrF-exposed sulfonate-ester containing PHS-EAdMA-PStS positive tone resist; FIG. 4(b) shows an image of a KrF-exposed sulfonate-ester containing PHS-EAdMA-PStS negative tone resist; FIG. 4(c) shows an image of a EUV-exposed PHS-EAdMA-PStS positive tone resist; and FIG. 4(d) shows an image of an EUV-exposed PHS-EAdMA-PStS negative tone resist. The positive tone resists were baked and developed with an ethylene glycol solvent and the negative tone resists were baked and developed with n-butyl acetate.

Figure 5A:
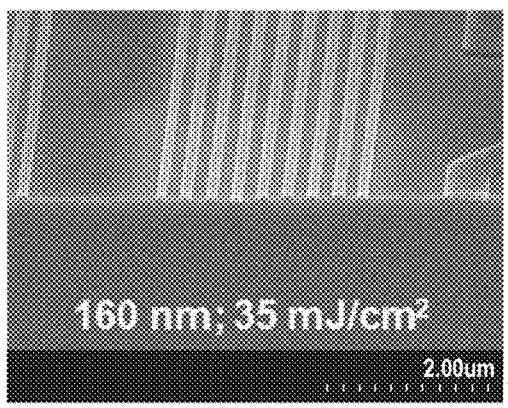
FIGS. 5($a$)-5($d$) are SEM micrographs of KrF imaging results for the NBHFAMA-ECpMA-NM-PStS (NBHFAMA-ECpMA-NM-PStS/TPSN/TPS HFB) resist of the present invention.
Figure 5B:
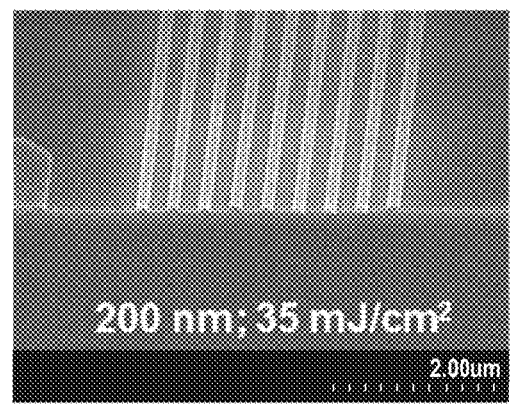
Figure 5C:
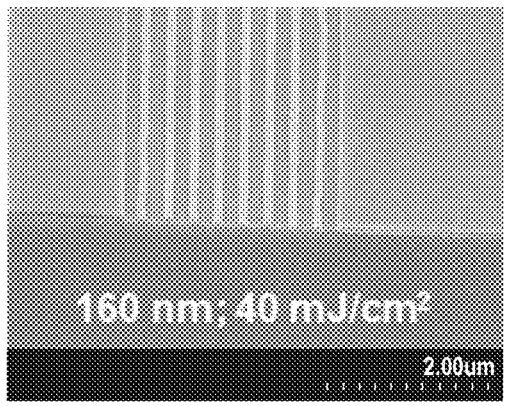
Figure 5D:
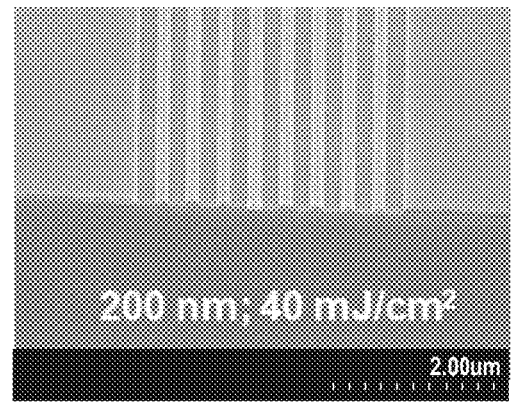

FIGS. 5(a) and 5(b) show images of KrF-exposed lactone-based sulfonate-ester containing NBHFAMA-ECpMA-NM-PStS positive tone resists and FIGS. 5(c) and 5(d) show images of KrF-exposed lactone-based sulfonate-ester containing NBHFAMA-ECpMA-NM-PStS negative tone resists. The positive tone NBHFAMA-ECpMA-NM-PStS resists were baked and developed with ethylene glycol/isopropyl alcohol EG/IPA (50:50 v/v) and the negative tone NBHFAMA-ECpMA-NM-PStS resists were baked and developed with ethyl amyl ketone (EAK).

Figure 6A:
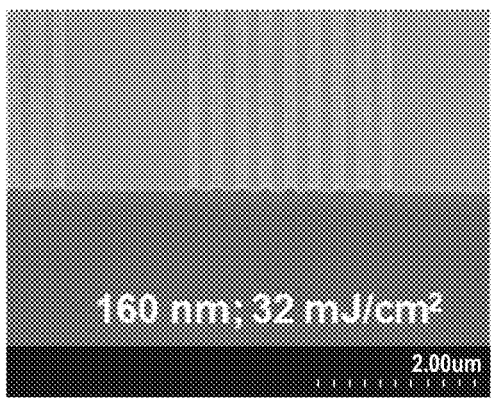
FIGS. 6($a$)-6($d$) are SEM micrographs of imaging results for the NBHFAMA-ECpMA-PStS (NBHFAMA-ECpMA-PStS/TPSN/TPS HFB) resist of the present invention.
Figure 6B:
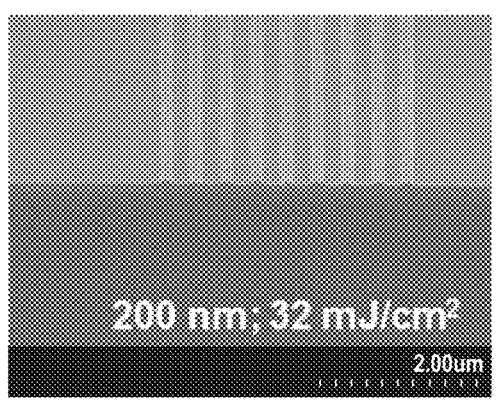
Figure 6C:
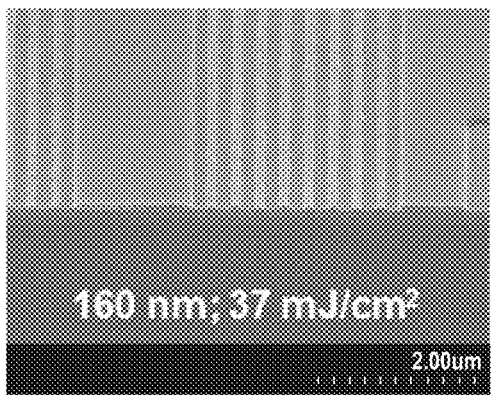
Figure 6D:
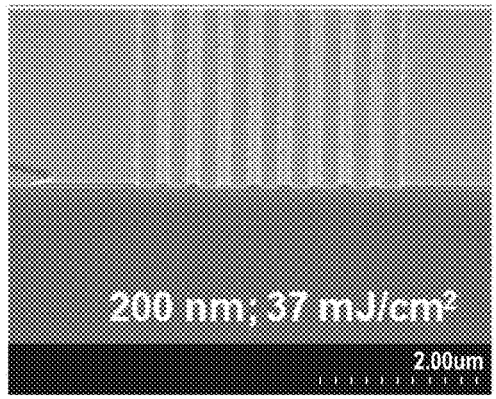

FIGS. 6(a) and 6(b) show images of KrF-exposed lactone-free sulfonate-ester containing NBHFAMA-ECpMA-PStS positive tone resists and FIGS. 6(c) and 6(d) show images of KrF-exposed lactone-free sulfonate-ester containing NBHFAMA-ECpMA-PStS negative tone resists. The positive tone NBHFAMA-ECpMA-PStS resists were baked and developed with EG/IPA (50:50 v/v) and the negative tone NBHFAMA-ECpMA-PStS resists were baked and developed with EAK.

As indicated in the discussion of FIGS. 4, 5, and 6, high resolution KrF and EUV imaging results for resists containing the sulfonate-ester containing polymers described herein allow either positive or negative tone imaging depending on the organic solvent developer used. FIGS. 7-13 are KrF contrast curve graphs for resist resists containing the sulfonate-ester containing polymers described herein or standard photoresist polymers. The resists that were used in the experiments associated with FIGS. 7-13 were KrF exposed and developed using positive tone or negative tone developer solvent. Table 2 shows the polymer composition and characterization data for the polymers of FIGS. 7-13 and Example 2 provides the general procedure by which the resists were prepared.

In the experiments associated with FIGS. 7-13, ethylene glycol (EG) (i.e., a polyhydric alcohol) alone or in combination with isopropyl alcohol (EG/IPA 50:50 v/v) was used to provide positive tone images and a ketone and/or acetate solvent was used to provide negative tone images. The following negative tone solvents were investigated for contrast improvement: anisole, methyl amyl ketone (MAK), n-butyl acetate (nBA), n-pentylacetate (nPA), and ethyl amyl ketone (EAK; also known as 3-octanone). The developer nBA is the standard industry developer at present for ArF immersion lithography.

TABLE 2

POLYMER COMPOSITION AND CHARACTERIZATION DATA

| Polymer | Composition from $^{13}$C NMR | Molecular Weight from GPC (Daltons) | | | TGA (° C.) at 5% weight loss |
|---|---|---|---|---|---|
| | | Mn | Mw | Mw/Mn | |
| Poly(4-hydroxystyrene-co-2-ethyl-2-adamantyl methacrylate) | PHS-EAdMA (60/40) | 3350 | 6840 | 2.04 | |
| Poly(4-hydroxystyrene-co-2-ethyl-2-adamantyl methacrylate- | PHS-EAdMA- | 3600 | 7020 | 1.95 | |

TABLE 2-continued

POLYMER COMPOSITION AND CHARACTERIZATION DATA

| Polymer | Composition from $^{13}$C NMR | Molecular Weight from GPC (Daltons) | | | TGA (° C.) at 5% weight loss |
|---|---|---|---|---|---|
| | | Mn | Mw | Mw/Mn | |
| co-2-Hydroxypinanyl-3-(4-styrenesulfonate) | PStS [55/40/5] | | | | |
| Poly(5-acryloyloxy-2,6-norbornanecarbolactone-co-2-ethyl-2-cyclopentayl methacrylate) | NM-ECpMA [63/37] | 9750 | 20100 | 2.06 | 190 |
| Poly(5-acryloyloxy-2,6-norbornanecarbolactone-co-2-ethyl-2-cyclopentayl methacrylate-co-2-Hydroxypinanyl-3-(4-styrenesulfonate) | NM-ECpMA-PStS [53/38/9] | 9790 | 19280 | 1.97 | 156 |
| Poly(2-[1',1',1'-trifluoro-2'-(trifluoromethyl)-2'-hydroxy)propyl-3-norbornyl methacrylate-co-2-ethyl-2-cyclopentayl methacrylate-co-5-acryloyloxy-2,6-norbornanecarbolactone) | NBHFAMA-ECpMA-NM [47/42/11] | 13820 | 28050 | 2.03 | 185 |
| Poly(2-[1',1',1'-trifluoro-2'-(trifluoromethyl)-2'-hydroxy)propyl-3-norbornyl methacrylate-co-2-ethyl-2-cyclopentayl methacrylate-co-5-acryloyloxy-2,6-norbornanecarbolactone-co-2-Hydroxypinanyl-3-(4-styrenesulfonate) | NBHFAMA-ECpMA-NM-PStS [28/31/10/31] | 12000 | 20070 | 1.67 | 130 |
| Poly(2-[1',1',1'-trifluoro-2'-(trifluoromethyl)-2'-hydroxy)propyl-3-norbornyl methacrylate-co-2-ethyl-2-cyclopentayl methacrylate) | NBHFAMA-ECpMA [61/39] | 13560 | 25740 | 1.89 | 190 |
| Poly(2-[1',1',1'-trifluor-2'-(trifluoromethyl)-2'-hydroxy)propyl-3-norbornyl methacrylate-co-2-ethyl-2-cyclopentayl methacrylate-co-2-Hydroxypinanyl-3-(4-styrenesulfonate) | NBHFAMA-ECpMA-PStS [35/38/27] | 9370 | 15490 | 1.65 | 135 |
| Poly(5-acryloyloxy-2,6-norbornanecarbolactone-co-Hydroxy-1-admantylmethacrylate-co-2-ethyl-2-cyclopentayl methacrylate) | NM-Hd-ECpMA [53/10/37] | 7690 | 18530 | 2.41 | 180 |

Figure 7A:
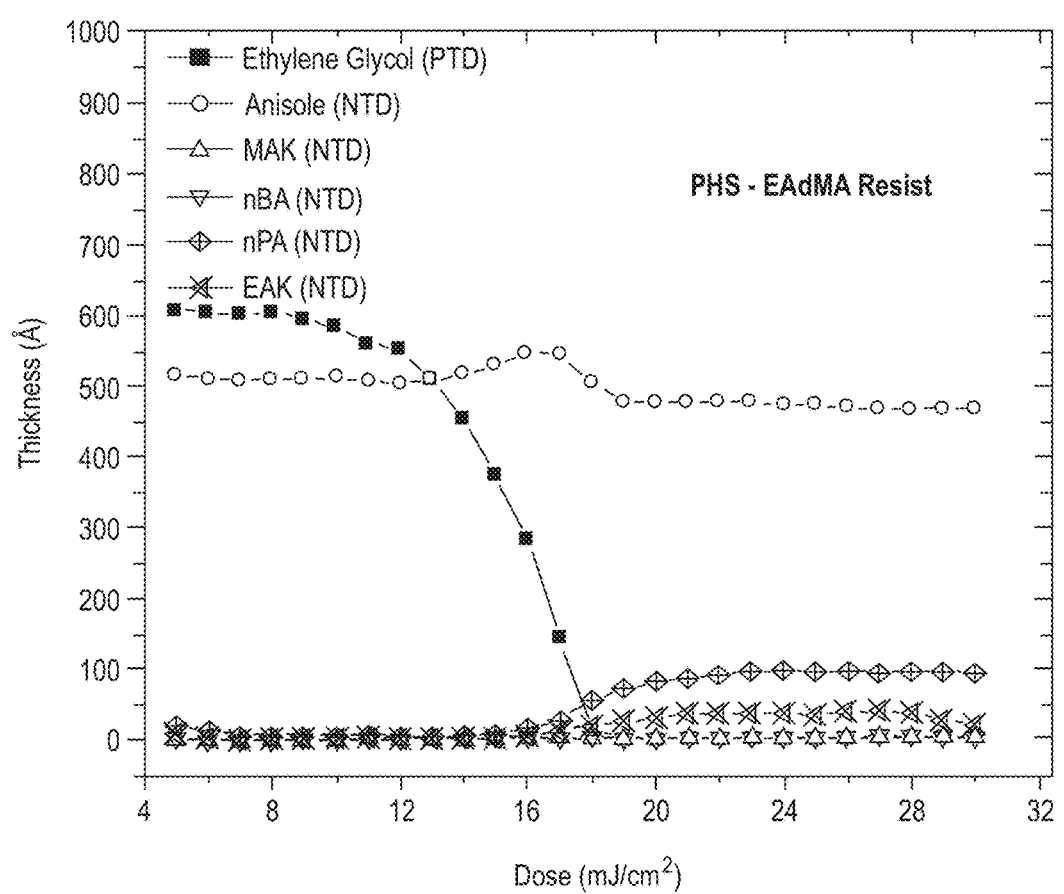
FIG. 7($a$) is a KrF contrast curve graph for the photoresist PHS-EAdMA and FIG. 7($b$) is a KrF contrast curve graph for the same photoresist with an acid-labile sulfonate-ester group, PHSEAdMA-PStS.
Figure 7B:
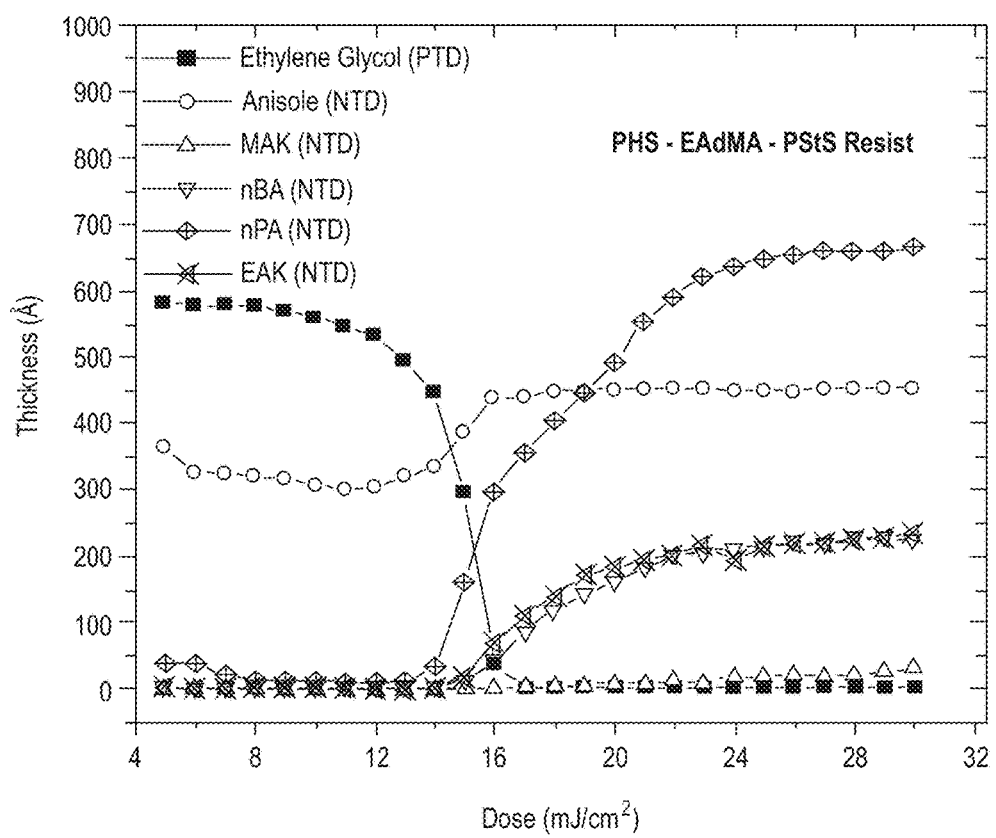

As shown in FIG. 7(a), the standard PHS-EAdMA resist produced high contrast KrF positive tone development with the PTD solvent ethylene glycol, but had very poor contrast for all KrF negative tone development with all of the NTD solvents used (i.e., anisole, MAK, nBA, nPA, and EAK). By contrast, the sulfonate-ester containing PHS-EAdMA-PStS resist of the present invention produced very high contrast KrF PTD with ethylene glycol and very high contrast KrF NTD with nPA. The KrF contrast curve data of FIG. 7(b) demonstrate the potential of PHS-EAdMA-PStS photoresists for organic solvent based dual-tone imaging. FIGS. 8-13 show that further improvement in resist contrast can be achieved with different polymer compositions. FIGS. 8-10 show PTD and NTD contrast data for single polymer compositions; FIGS. 12 and 13 show PTD and NTD contrast data for combination (or blend) polymer compositions; and FIG. 11 provides a comparison of NTD contrast curve results with nBA for single and combination polymer compositions.

Figure 8A:
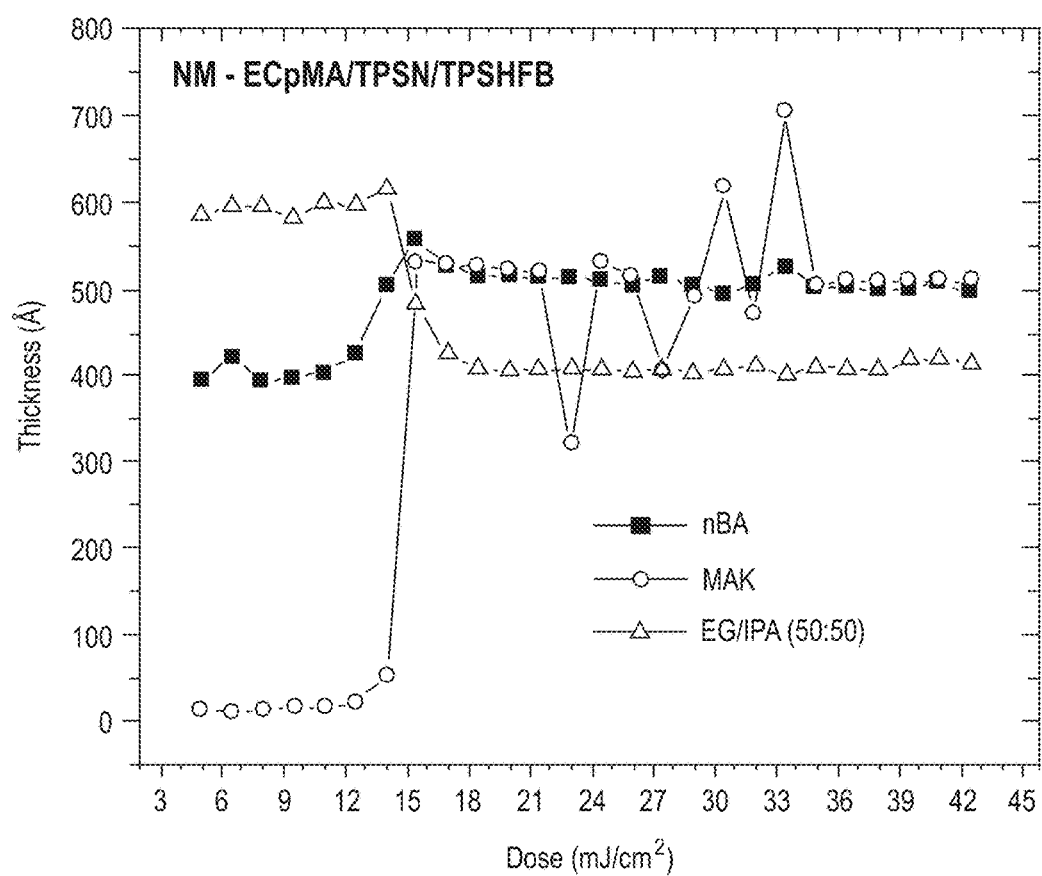
FIG. 8($a$) is a KrF contrast curve graph for the photoresist NM-ECPMA and FIG. 8($b$) is a KrF contrast curve graph for the same photoresist with an acid-labile sulfonate-ester group, NM-ECpMA-PStS.
Figure 8B:
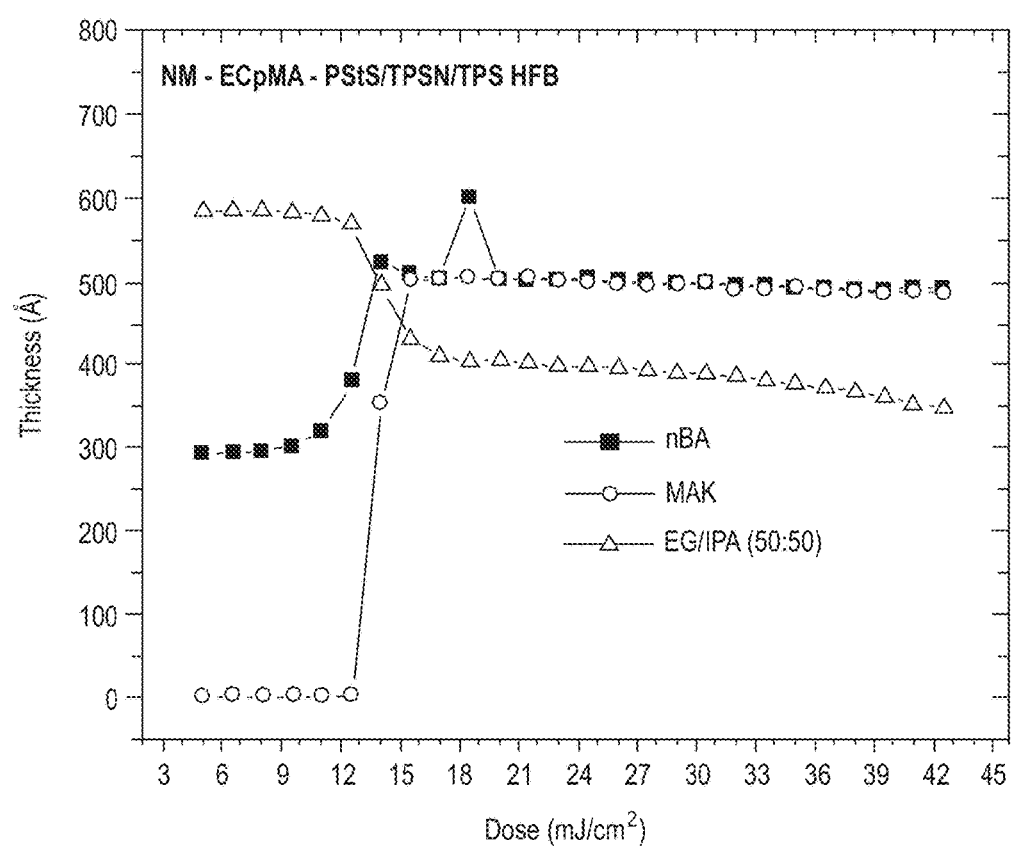

FIGS. 8(a) and 8(b) show that the sulfonate-ester containing lactone-based resist NM-ECpMA-PStS (FIG. 8(b)) has improved NTD with MAK over the traditional resist NM-ECpMA (FIG. 8(a)).

Figure 9A:
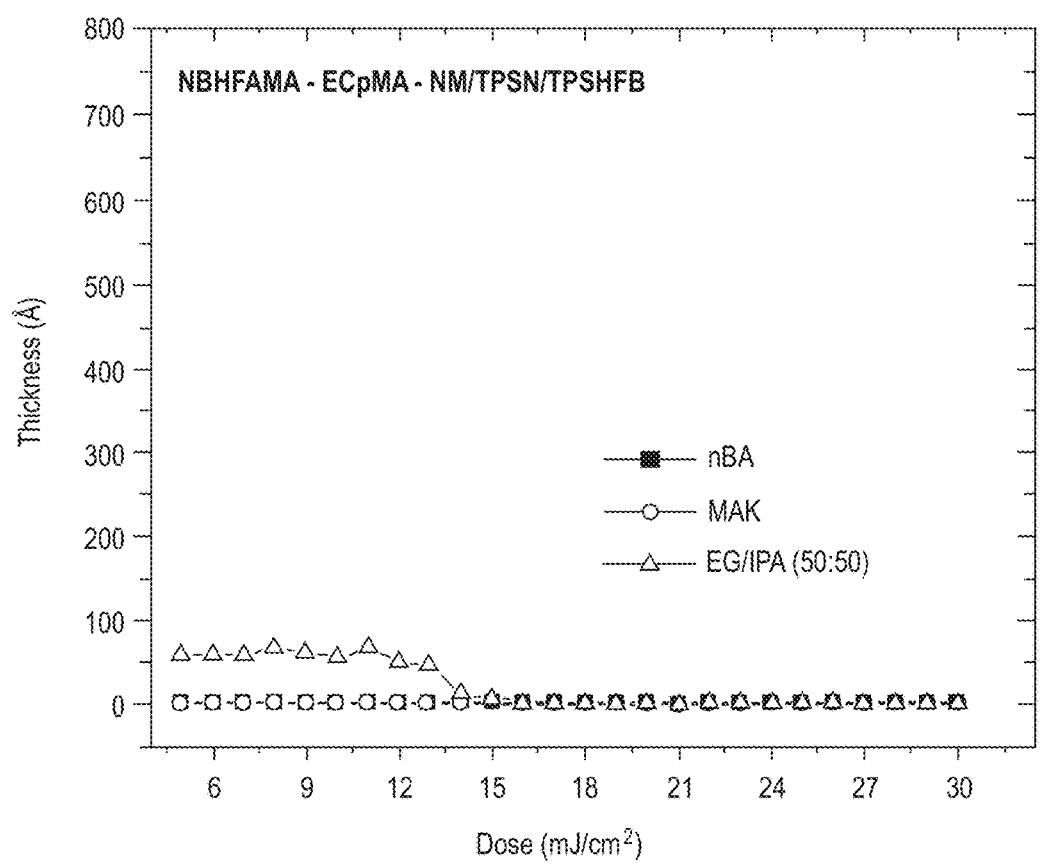
FIG. 9($a$) is a KrF contrast curve graph for the photoresist NBHFAMA-ECpMA-NM and FIG. 9($b$) is a KrF contrast curve graph for the same photoresist with an acid-labile sulfonate-ester group, NBHFAMA-ECpMA-NM-PStS.
Figure 9B:
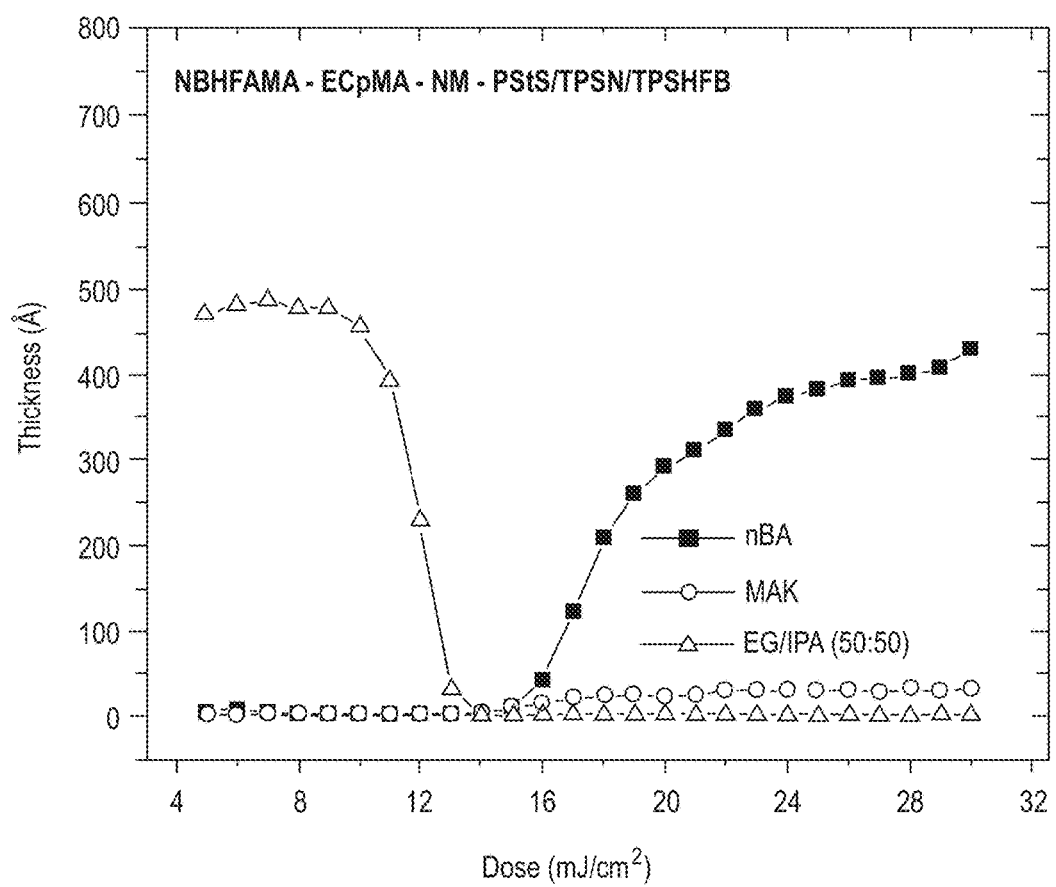

FIGS. 9(a) and 9(b) show that the sulfonate-ester containing lactone-based resist NBHFAMA-ECpMA-NM-PStS (FIG. 9(b)) has enhanced PTD with EG/IPA (50:50 v/v) and enhanced NTD with nBA over the traditional NBHFAMA-ECpMA-NM resist. Based upon the data of FIG. 9, the NBHFAMA-ECpMA-NM-PStS resist is an effective organic solvent developable dual-tone resist.

Figure 10A:
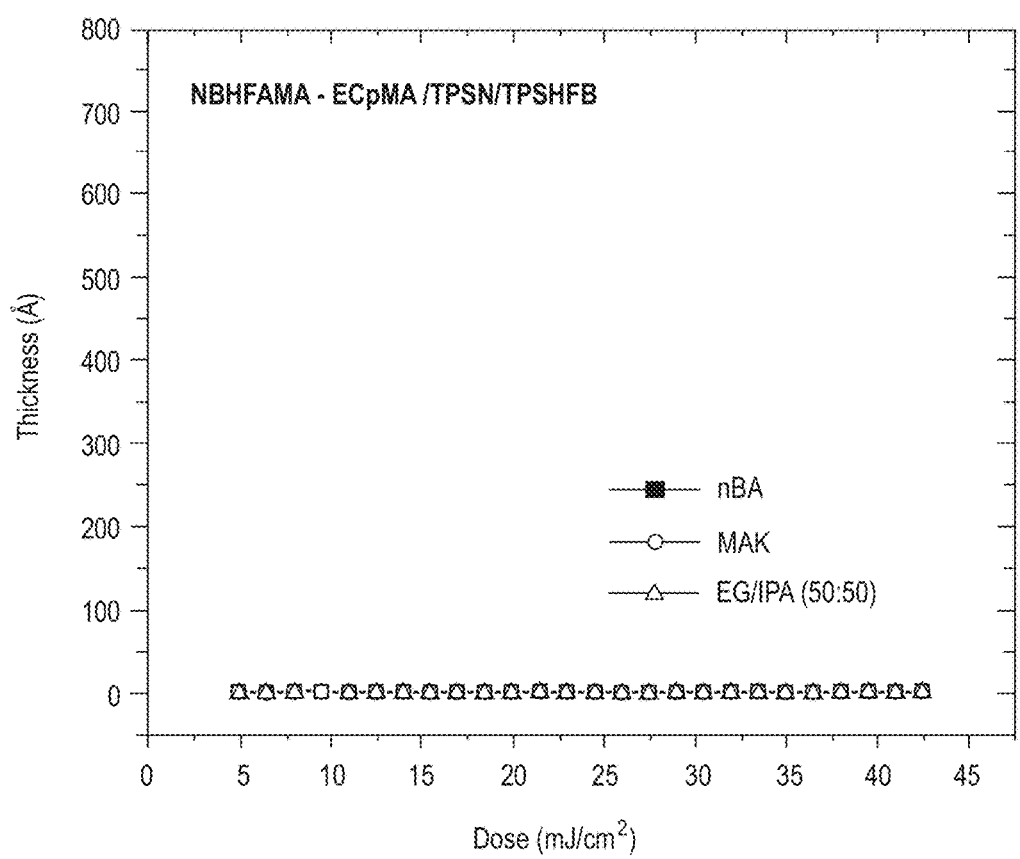
FIG. 10($a$) is a KrF contrast curve graph for the photoresist NBHFAMA-ECpMA.
Figure 10B:
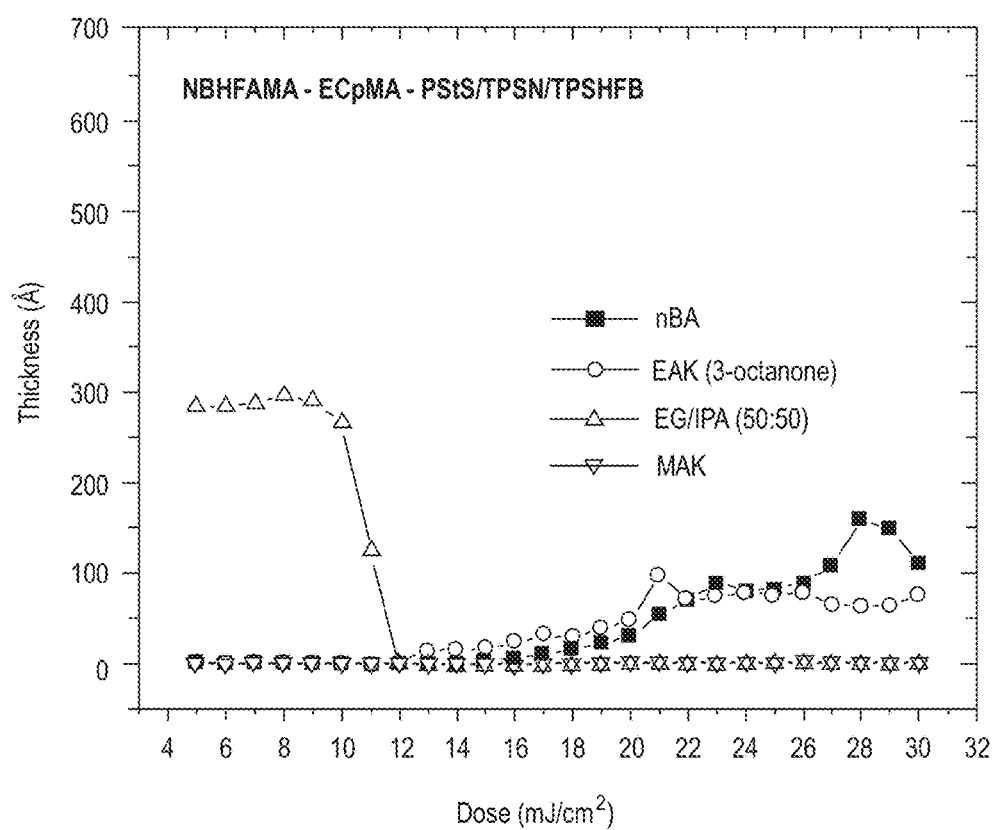
Figure 11:
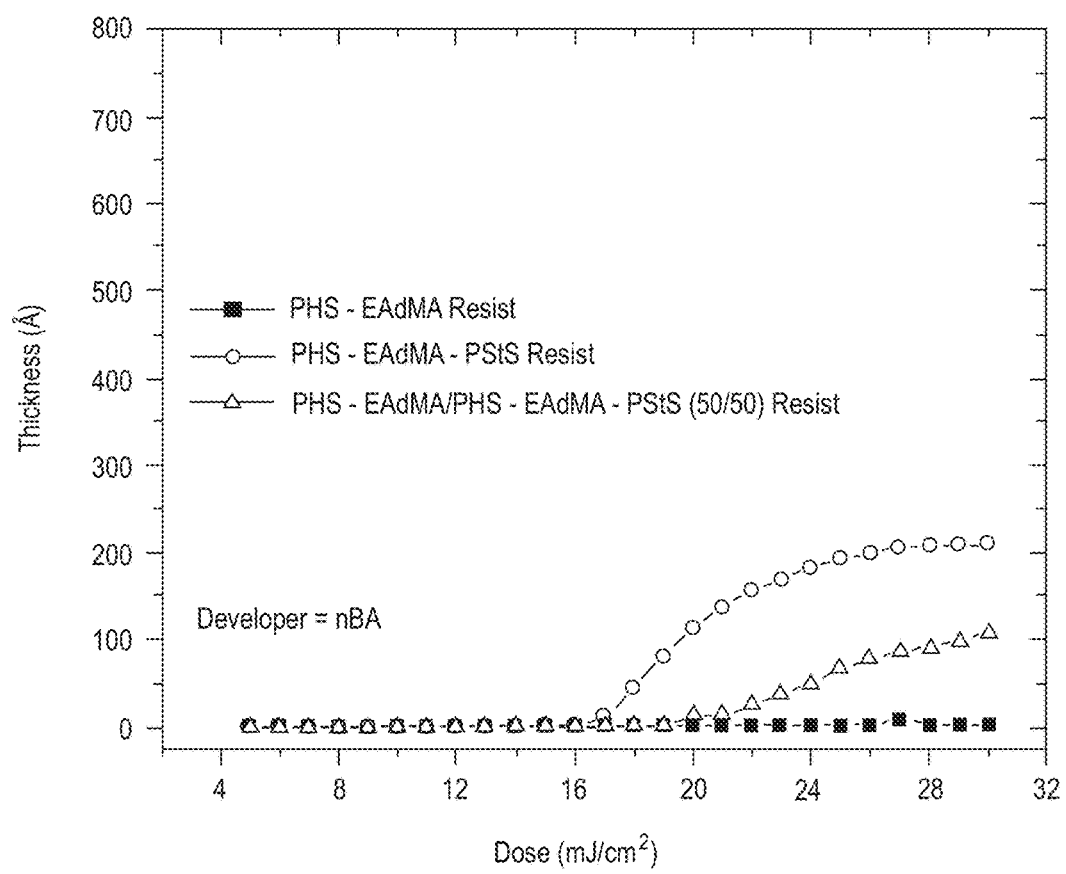
FIG. 11 is a KrF contrast curve graph for the photoresists PHS-EAdMA; PHS-EAdMA-PStS; and PHS-EAdMA/PHS-EAdMA-PStS (50:50) blend.

FIGS. 10(a) and 10(b) show that the sulfonate-ester containing lactone-free resist NBHFAMAM-ECpMA-PStS (FIG. 10(b)) has enhanced PTD with EG/IPA (50:50 v/v) and enhanced NTD with nBA and EAK over the traditional NBHFAMA-ECpMA resist. (FIG. 10(a))

FIG. 11 compares KrF contrast curves for three resists each developed with the NTD solvent nBA. The resists tested were a resist prepared from the polymer PHS-EAdMA; a resist prepared from the sulfonate-ester containing resist polymer PHS-EAdMA-PStS; and a resist prepared with a 50:50 blend of the two foregoing resists polymers (PHS-EAdMA/PHS-EAdMA-PStS). As shown in FIG. 11, the inclusion of the sulfonate-ester containing resist polymer increased the NTD of the resulting resist. The resist prepared from the sulfonate-ester containing resist polymer showed a marked improvement in contrast for both PTD and NTD imaging (FIG. 11) over its traditional counterpart. Similarly, the resist prepared from the blended polymers also showed improved NTD (FIG. 11) over its traditional counterpart.

Figure 12A:
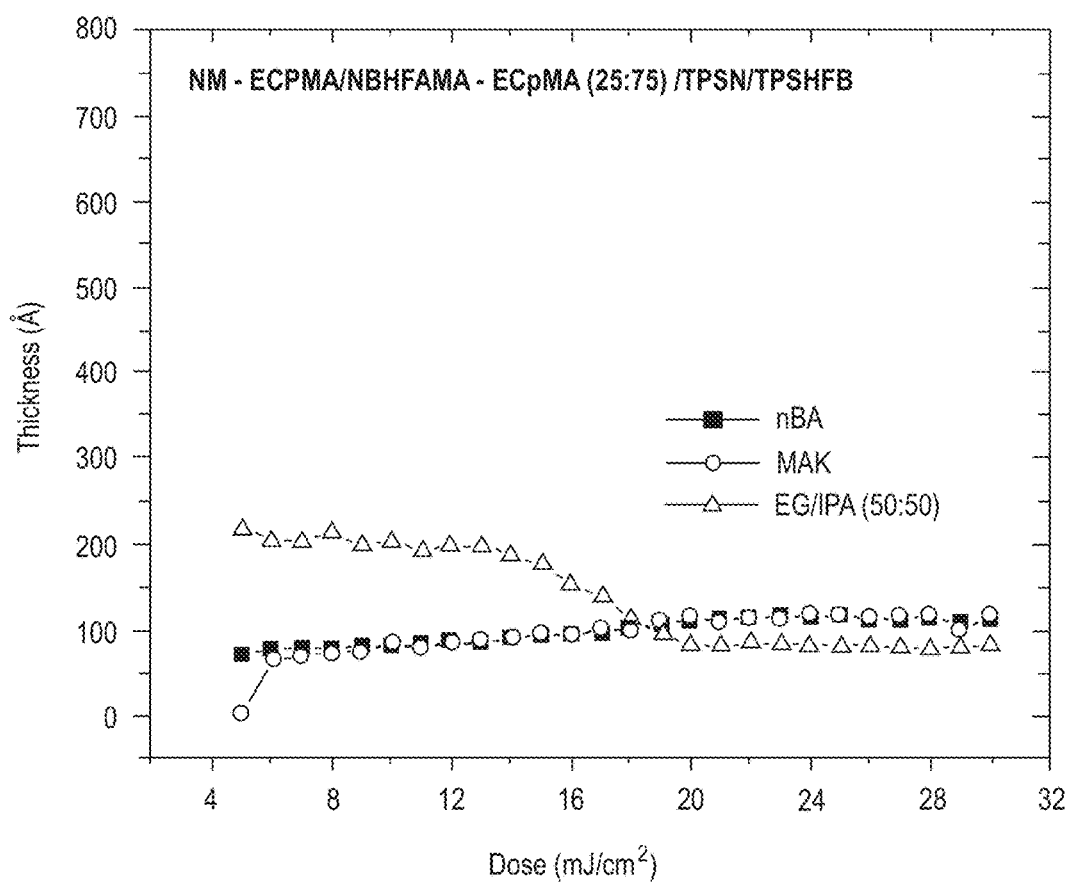
FIG. 12($a$) is a KrF contrast curve graph for the photoresist NM-ECpMA/NBHFAMA-ECpMA (25:75)
Figure 12B:
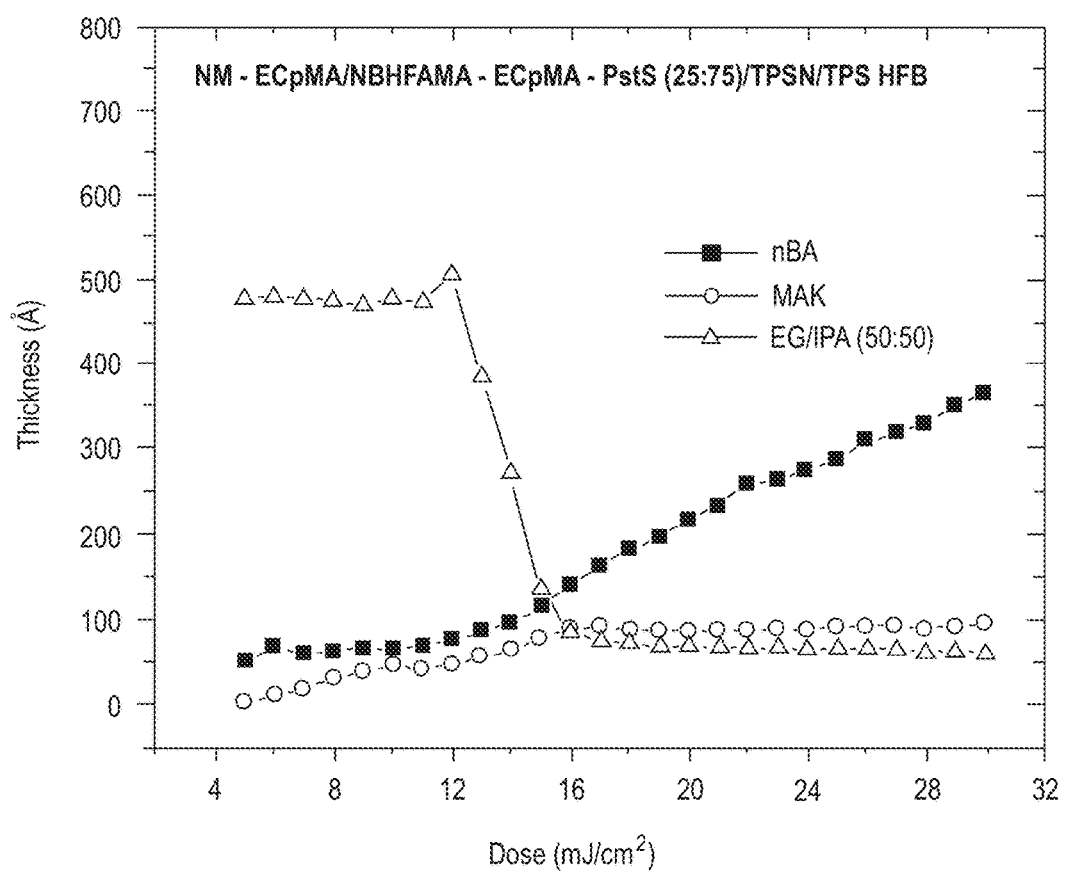

FIGS. 12(a) and 12(b) show a comparison of PTD and NTD contrast curves for a resist comprised of polymer blends with and without sulfonate-ester moieties. FIG. 12(a) shows the contrast curve results for a resist prepared from a traditional lactone-based resist polymer blended with a traditional lactone-free resist polymer, NM-ECpMA/NB-HFAMA-ECpMA (25:75). FIG. 12(b) shows the contrast curve results for a resist prepared from a traditional lactone-based resist polymer blended with a sulfonate-ester containing lactone-based resist polymer, NM-ECpMA/NB-HFAMA-ECpMA-PStS (25:75). As shown in FIG. 12(a), resists prepared from the traditional polymer blend showed good contrast for PTD imaging (development with the PTD solvent EG/IPA (50:50 v/v)), but very low contrast for NTD imaging (development with the NTD solvents nBA and MAK). By contrast, resists prepared from traditional/sulfonate-ester polymer blend showed dramatic contrast curves with both PTD and NTD imaging (FIG. 12(b)).

Figure 13A:
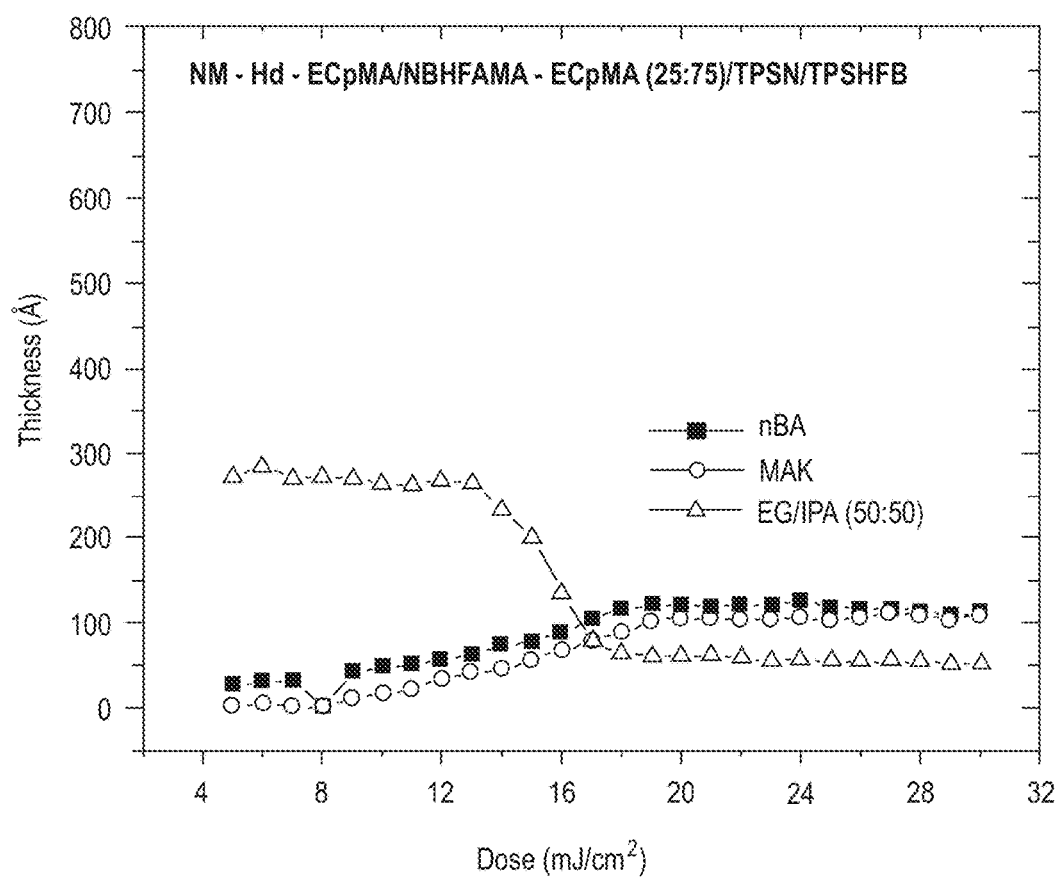
FIG. 13($a$) is a KrF contrast curve graph for the photoresist NM-Hd-ECpMA/NBHFAMA-ECpMA (25:75)
Figure 13B:
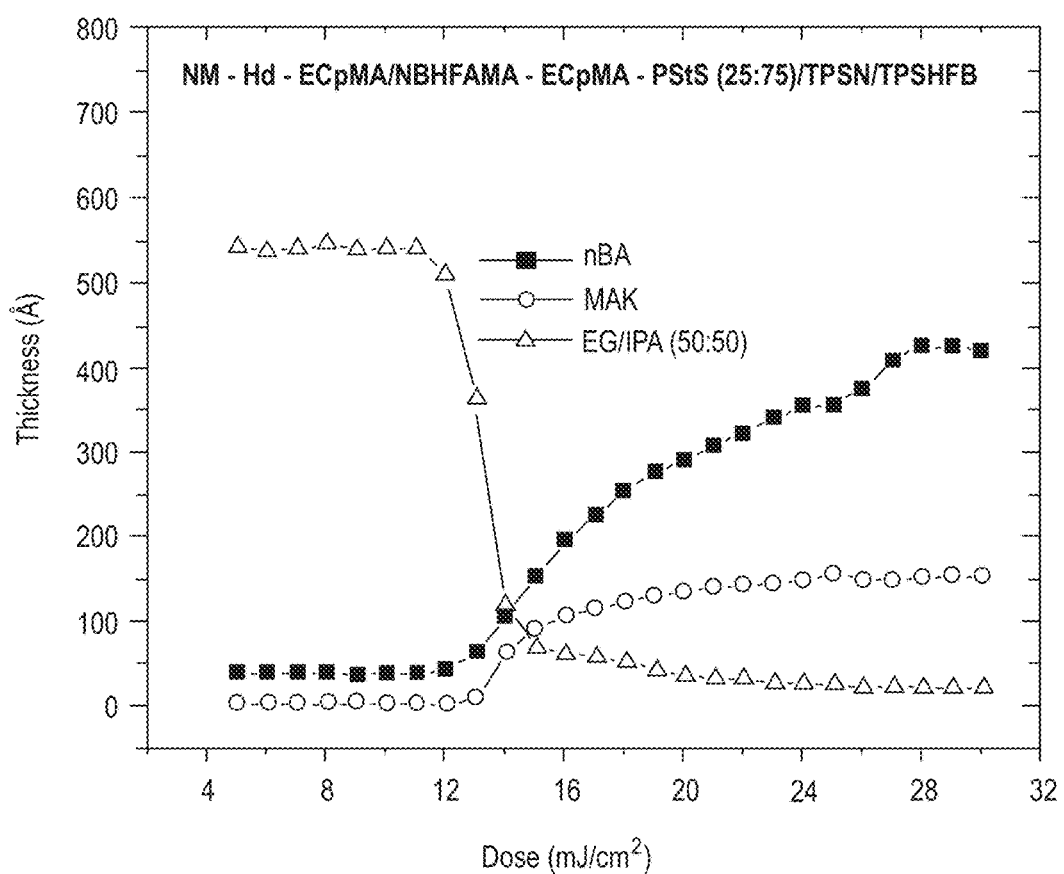

FIGS. 13(a) and 13(b) show results comparable to those described for FIGS. 12(a) and 12(b). FIG. 13(a) shows PTD and NTD contrast curves for a resist comprised of a traditional NM-Hd-ECpMA resist polymer blended with a traditional lactone-free resist polymer (NM-Hd-ECpMA/NB-HFAMA-ECpMA). FIG. 13(b) shows PTD and NTD contrast curves for a traditional NM-Hd-ECpMA resist polymer blended with a sulfonate-ester containing lactone-free resist polymer (NM-Hd-ECpMA/NBHFAMA-ECpMA-PStS). As shown in FIGS. 13(a) and 13(b), resists prepared with the traditional polymer and the sulfonate-ester containing polymer had significantly higher contrast with both PTD and NTD imagining over the polymer blends that did not include a sulfonate-ester containing moiety. As noted therein, the dual-tone resist was developed with the PTD solvent, EG/IPA (50:50 v/v), to produce the positive tone image, and the dual tone resist was developed with the NTD solvents, nBA and MAK, to produce the negative tone images.

The results shown in FIGS. 12 and 13 demonstrate that optimization of resist polymer composition with different groups and/or blends of traditional and sulfonate-ester containing resist polymers can enhance the contrast for PTD and NTD imaging.

The organic solvent developable photoresists described herein is used in a lithographic process comprising the steps of: (a) preparing a resist composition comprising a photoresist polymer comprising an acid-labile sulfonate-ester moiety, a casting solvent, and optionally a photoacid generator (PAG); (b) applying the resist composition of step (a) to a substrate to form a resist film; (c) optionally, baking the resist film (post-application bake, PAB); (d) exposing the resist film to radiation; (e) optionally, baking the resist film (post-exposure bake, PEB); (f) developing the resist film with an organic solvent to expose a pattern etched into the film; and (g) optionally, rinsing the resist film with water or organic solvent.

The acid-labile sulfonate-ester moiety may be present in the photoresist polymer in a range of 1-50 wt %. The acid-labile sulfonate-ester moiety may be present in the poly(hydroxystyrene) photoresist polymer in a range of 5-10 wt %. The acid-labile sulfonate-ester moiety may be present in the lactone or lactone free photoresist polymer in a range of 5-31 wt %.

The substrate for the lithographic process may be selected from the group consisting of silicon, silicon dioxide, aluminum oxide, sapphire, germanium, gallium arsenide, an alloy of silicon and germanium, and indium phosphide. In a preferred embodiment of the invention, the substrate is silicon.

The casting solvent used to dissolve the resist polymer may be selected from propylene glycol methyl ether acetate (PGMEA), cyclohexanone (CHYN), or a combination of PGMEA and CHYN. One of skill in the art will appreciate that any other casting solvents used in the semiconductor arts may be substituted for any of the foregoing.

The PAG present in the composition is typically in the range of about 1-15 mol % and may or may not be bound to the photoresist polymer. PAGs incorporated into the resists should have high thermal stability, i.e., be stable to at least 140° C., so they are not degraded during pre-exposure processing. Examples of PAGs that may be used with the resists of the present invention include, without limitation, sulfonates, onium salts, aromatic diazonium salts, sulfonium salts, diaryliodonium salts and sulfonic acid esters of N-hydroxyamides or N-hydroxyimides. Specific examples of typical PAGs may be selected from the following list of PAGs:

(1) sulfonium salts, such as triphenylsulfonium perfluoromethanesulfonate (triphenylsulfonium triflate), triphenylsulfonium perfluorobutanesulfonate, triphenylsulfonium perfluoropentanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenylsulfonium iodide, 2,4,6-trimethylphenyldiphenylsulfonium perfluorobutanesulfonate, 2,4,6-trimethylphenyldiphenylsulfonium benzenesulfonate, diphenylethylsulfonium chloride, and phenacyldimethylsulfonium chloride;

(2) halonium salts, particularly iodonium salts, including diphenyliodonium perfluoromethanesulfonate (diphenyliodonium triflate), diphenyliodonium perfluorobutanesulfonate, diphenyliodonium perfluoropentanesulfonate, diphenyliodonium hexafluoroantimonate, diphenyliodonium hexafluoroarsenate, bis-(t-butylphenyl)iodonium triflate, and bis-(t-butylphenyl)-iodonium camphanylsulfonate;

(3) α,α'-bis-sulfonyl-diazomethanes such as bis(p-toluenesulfonyl)diazomethane, methylsulfonyl p-toluenesulfonyldiazomethane, 1-cyclohexylsulfonyl-1-(1,1-dimethylethylsulfonyl)diazomethane, and bis(cyclohexylsulfonyl)diazomethane;

(4) trifluoromethanesulfonate esters of imides and hydroxyimides, e.g., α-(trifluoromethylsulfonyloxy)-bicyclo[2.2.1]hept-5-ene-2,3-dicarboximide (MDT);

(5) nitrobenzyl sulfonate esters such as 2-nitrobenzyl p-toluenesulfonate, 2,6-dinitrobenzyl p-toluenesulfonate, and 2,4-dinitrobenzyl p-trifluoromethylbenzene sulfonate;

(6) sulfonyloxynaphthalimides such as N-camphorsulfonyloxynaphthalimide and N-pentafluorophenylsulfonyloxynaphthalimide;

(7) pyrogallol derivatives (e.g., trimesylate of pyrogallol);

(8) naphthoquinone-4-diazides;

(9) alkyl disulfones;

(10) s-triazine derivatives, as described in U.S. Pat. No. 4,189,323; and

(11) miscellaneous sulfonic acid generators including t-butylphenyl-α-(p-toluenesulfonyloxy)-acetate, t-butyl-α-(p-toluenesulfonyloxy)acetate, and N-hydroxy-naphthalimide dodecane sulfonate (DDSN), and benzoin tosylate.

It is to be understood by those of skill in the art that the PAB and PEB of the method of the present invention will vary with the materials and radiation that are used to carry out the method. For EUV exposure, typical PAB and PEB temperatures and bake times range from 50° C. to 150° C. for 30 to 200 seconds, with preferred temperatures and bake times ranging from 100 to 130° C. for 60 to 120 seconds. PAB temperatures may sometimes, but not necessarily, be higher than PEB temperatures and PEB bake times may sometimes, but not necessarily, be longer than PAB bake times.

Exposure of the photoresist may occur by any suitable method including without limitation, DUV optical radiation, ion-beam projection, x-ray radiation, e-beam radiation, focused beam radiation, and EUV radiation. The sulfonate-ester containing photoresists of the present invention may also be used for mixed lithography processes wherein more than one exposure method is used, such as for example, e-beam and EUV radiation. In another embodiment of the invention, the photoresist is exposed with radiation selected from the group consisting of deep ultraviolet (DUV) radiation (248 nm and 193 nm), extreme ultraviolet (EUV) radiation (13.5 nm), electron beam (e-beam) radiation, and ion beam radiation.

As previously noted, with dual-tone resists, the choice of organic solvent will dictate whether the final resist will be a positive tone or negative tone resist. As a general rule, a dual-tone resist developed with a polyhydric alcohol-based solvent will produce a positive tone image and a dual-tone resist developed with a ketone and/or acetate-based solvent will produce a negative tone image.

Examples of polyhydric alcohol-based PTD solvents that may be used to develop positive tone resists include, without limitation, ethylene glycol, glycerol, erythritol, threitol, arabitol, xylitol, ribitol, mannitol, sorbitol, galactitol, fucitol, iditol, inositol, volemitol, isomalt, maltitol, lactitol, maltotriitol, maltotetraitol, polyglycitol. The polyhydric alcohol may be used alone (i.e., neat) to develop the positive tone resist or it be used in combination with water or with other solvents, such as for example, aliphatic alcohols, diols, and/or triols. Examples of other organic solvents that may be used to develop positive tone resists include, without limitation, propanediols, propanetriols, butanediols, butanetriols, pentanediols, pentanetriols, hexanediols, hexanetriols, octanediols, octanetriols, cyclopropanol, cyclobutanol, cyclopentanol, phenylmethanol, and phenylethanol. Within the context of the present invention, a preferred polyhydric alcohol for development of positive tone resists is ethylene glycol (EG) alone or in combination with isopropyl alcohol (IPA).

Examples of acetone or ketone-based NTD solvents that may be used to develop negative tone resists include without limitation, anisole, methyl amyl ketone (MAK), n-Butyl acetate (nBA), n-pentylacetate (nPA), and ethyl amyl ketone (EAK; also known as 3-octanone).

With respect to the final rinsing step of the lithographic method, within the context of the present invention, a positive tone resist film will preferably be rinsed with water while a negative tone resist film will preferably be rinsed with an organic solvent.

In addition to the foregoing, a quencher may also be used in the processing of the organic solvent developable resists of the present invention. The quencher may be a base quencher or a radiation sensitive quencher, such as a photodecomposable base (PDB).

Examples of base quenchers that may be used with the present invention include, without limitation, aliphatic amines, aromatic amines, and combinations thereof. Specific examples of base quenchers include, without limitation, 2-phenyl benzimidazole; tert-butyl 2-phenyl-1,3-benzodiazole-1-carboxylate; dimethylamino pyridine; 7-diethylamino-4-methyl coumarin (Coumarin 1); tertiary amines; sterically hindered diamine and guanidine bases, such as 1,8-bis(dimethylamino)naphthalene (e.g., PROTON SPONGED); berberine; and polymeric amines (such as in the PLURONIC® or TETRONIC® series commercially available from BASF). Tetra alkyl ammonium hydroxides or cetyltrimethyl ammonium hydroxide may be used as a base quencher when the PAG is an onium salt.

Examples of PDBs that may be used with the present invention include, without limitation, arylsulfonium or iodonium salts of carboxylates, hydroxides, and sulfamates. An example of a monofunctional PDB that can be used with the present invention is triphenylsulfonium heptafluorobutyrate (TPS-HFB). Additional PDBs that may be used with the present invention are described in commonly owned patent application Ser. No. 13/219,599 to Ayothi et al. and include fluorinated bifunctional PDBs, asymmetrical PDBs, and dicarboxylate anion PDBs.

The organic solvent developable CA resists described herein have utility in a number of applications. For example, they may be used to manufacture semiconductor devices, such as integrated circuits. As noted above, they may also be useful for applications where basic solvents are not suitable, such as the fabrication of chips patterned with arrays of biomolecules or deprotection applications that do not require the presence of acid moieties.

It is to be understood that while the invention has been described in conjunction with the embodiments set forth above, the foregoing description as well as the examples that follow are intended to illustrate and not limit the scope of the invention. Further, it is to be understood that the embodiments and examples set forth herein are not exhaustive and that modifications and variations of the invention will be apparent to those of ordinary skill in the art without departing from the scope and spirit of the invention.

All patents and publications mentioned herein are incorporated by reference in their entireties.

EXPERIMENTAL

The following examples are set forth to provide those of ordinary skill in the art with a complete disclosure of how to make and use the aspects and embodiments of the invention as set forth herein. While efforts have been made to ensure accuracy with respect to variables such as amounts, temperature, etc., experimental error and deviations should be taken into account. Unless indicated otherwise, parts are parts by weight, temperature is degrees centigrade, and pressure is at or near atmospheric. All components were obtained commercially unless otherwise indicated.

Materials and Methods:

All monomers were obtained from JSR Corporation, Tokyo, Japan.

All developer combinations used herein were measured as volume/volume (v/v). Resist blends disclosed herein were measured in molality; thus, within the context of the present invention, a resist blend of 25:75 would be understood by those of skill in the art to mean 0.75 and 0.25 molality.

2,2'-Azobis-(2-methylpropionitrile) (AIBN), (1S,2S,3R,5S)-[+]-pinanediol (CAS #78-67-1) was obtained from Aldrich Chemical Company, Milwaukee, Wis.

Propylene glycol monomethylether acetate (PGMEA) (CAS #108-65-6) and cyclohexanone (CHYN) (CAS #108-94-1) were obtained from JSR Corporation.

Triphenylsulfonium perfluoro-1-butanesulfonate (TPS-N) (CAS #144317-44-2) was obtained from JSR Corporation.

Methyl ethyl ketone (MEK) (CAS #78-93-3) was obtained from J.T. Baker Chemical Company, Phillipsburg, N.J., and used as received.

Ethylene glycol (EG) (CAS #107-21-1); ispropyl alcohol (IPA) (CAS #67-63-0); 0.26 N tetramethyl ammonium hydroxide (TMAH) (CAS #1899-02-1); anisole (CAS #100-66-3); methyl amyl ketone (MAK) (CAS #110-43-0); n-butyl acetate (nBA) (CAS #123-86-4); n-pentylacetate (nPA) (CAS #628-63-7); and ethyl amyl ketone (EAK) CAS #541-85-5) were obtained from Aldrich and used as received.

Triphenylsulfonium heptafluorobutyrate (TPS HFB) was synthesized from triphenylsulfonium bromide (CAS #3353-89-7) and silver heptafluorobutyrate (CAS #3794-64-7) by anion exchange reaction.

p-styrenesulfonyl chloride (CAS #2633-67-2) was obtained from TCI America.

DUV42P bottom anti-reflective coating (BARC) was obtained from Brewer Science Inc., Vichy, Mo.

2-Hydroxypinanyl-3-(4-styrenesulfonate) monomer was prepared using a modified literature procedure. To a stirred solution of (1S,2S,3R,5S)-[+]-pinanediol (2.23 g, 11 mmol) CAS #18680-27-8) and pyridine (10 mL) (CAS #110-86-1), p-styrenesulfonyl chloride (1.70 g, 10 mmol) was added slowly. After the addition was completed, the reaction mixture was stirred at room temperature for 15 h. The orange slurry reaction mixture obtained was added to water, extracted with ether, washed with 10% conc HCl, water, 5% NaHCO$_3$ and water. The organic layer was dried over MgSO$_4$. The oil (2.7 g) obtained was recrystallized in ether/hexane and dissolved in ethyl acetate and filtered through basic alumina (3 g). Evaporation under reduced pressure gave 2.62 g of pale yellow oil, which was dried under vacuum to produce 2.48 g of 2-hydroxypinanyl-3-(4-styrenesulfonate) monomer.

Nuclear magnetic resonance (NMR) measurements were done with a Bruker Avance 400 Solution NMR spectrometer using a deuterated solvent, hexadeuteroacetone (Acetone-d6), as an internal standard.

Gel permeation chromatography (GPC) was carried out with a Waters chromatograph calibrated with polystyrene standards using tetrahydrofuran (THF) as solvent.

Thermal decomposition temperatures of the experimental polymers was measured using a TA Instruments Hi-Res TGA 2950 Thermogravimetric Analyzer and was standardized at the thermal decomposition temperature at 5% weight loss at a scan rate of 5° C./min.

All KrF excimer laser (248 nm) exposures were performed in an ASML 550/300D stepper (Annular; 0.61 NA; $\sigma_{out}$=0.60; $\sigma_{out}$=0.35).

All EUV exposures were conducted on the Lawrence Berkeley National Laboratory Microfield Exposure Tool (LBNL-MET) with a numerical aperture (NA)=0.3 (Rotated Dipole)

Example 1

Polymer Synthesis, Purification, and Characterization

The photoresist polymers of FIG. 2 and Table 2 were synthesized using standard free radical solution polymerization techniques using azo initiator. Repeated precipitations from hexane or methanol were used to recover pure polymer free from impurities. The polymer composition was determined using 13C-NMR (inverse gate, chromium (iii) acetyl acetonate complex) and was very close to feed composition used in polymerization.

To a 100 mL round bottom flask with a magnetic stir bar, the following compounds were added together as a single mixture: (5-acryloyloxy-2,6-norbornanecarbolactone (2.55 g, 0.5 mmol); 2-ethyl-2-cyclopentayl methacrylate (1.67 g, 0.4 mmol); 2-hydroxypinanyl-3-(4-styrenesulfonate) (0.78, 0.1 mmol); 2,2'-azobis-(2-methylpropionitrile) (AIBN) (0.8 gram, 8 mmol); and methyl ethyl ketone (17.5 g). The reaction mixture was stirred, nitrogen flushed, and sealed using rubber septa. After 6 hours at 64° C., the reaction mixture was allowed to cool to room temperature and was then added with stirring to 500 mL of stirred hexanes. The precipitated polymer was stirred for 10 minutes and then filtered through a glass-fritted funnel. The recovered solid was washed with hexane and dried to pure polymer.

Example 2

Resist Preparation and Processing

Resist solutions were prepared in PGMEA or in PGMEA/CHYN (70:30) solvent, containing resin or polymer, and a photoacid generator (PAG) to yield a loading of 0.25 moles/kg solids in the coated film. Photodecomposable base (PDB) or quencher concentrations in the films were in the range of 0.1 moles/kg solids.

The resist formulations were filtered through a 0.2 μm Teflon filter, spin coated onto BARC (DUV42P) coated substrate, and post-application baked (PAB) at 110° C. for 60 seconds. After KrF or EUV exposure, the wafer was post-exposure baked (PEB) at 110° C. for 60 seconds, and developed in an organic solvent selected from either Ethylene Glycol (EG), EG/isopropyl alcohol (EG/IPA 50:50 v/v), anisole, methyl amyl ketone (MAK), n-butyl acetate (nBA), n-pentylacetate (nPA), or ethyl amyl ketone (EAK; also known as 3-octanone) for 30 seconds. Wafers developed with ethylene glycol solvent were rinsed with water before drying. Wafers developed with ketone or acetate organic solvents were rinsed with the same solvent before drying.

Table 1 shows several of the resist composition prepared and evaluated are according to the subject procedure.

Processing Conditions: Substrate—DUV 42P (63 nm); Resist FT—60 to 100 nm (nPA development used 100 nm); PAB—110 C/60 s; Exposure/Imaging—KrF (Annular; NA=0.61; $\sigma_{out}$=0.6; $\sigma_{in}$=0.35); EUV LBNL-MET (Rotated Dipole); PEB—110 C/60 s; Dev—30 s.

We claim:

1. A method comprising:
    preparing a dual-tone chemically amplified photoresist composition comprising an organic solvent developable photoresist polymer, the photoresist polymer comprising an acid-labile sulfonate-ester moiety in the range of 1-50 wt %, wherein the photoresist polymer comprises a repeating unit comprising 2-1',1',1'-trifluoro-2'-(trifluoromethyl)-2'-hydroxy)propyl-norbornyl methacrylate (NBHFAMA) and optionally a repeating unit derived from a hydroxystyrene, wherein the chemically amplified photoresist is developed with an organic solvent to produce a positive tone or negative tone image in a photoresist film.

2. The method of claim 1, wherein the photoresist polymer comprises a repeating unit derived from a hydroxystyrene and the acid-labile sulfonate-ester moiety is present in the photoresist polymer in a range of 5-10 wt %.

3. The method of claim 1, wherein the acid-labile sulfonate-ester moiety is present in the photoresist polymer in a range of 5-31 wt %.

4. The method of claim 1, wherein the photoresist polymer is blended with an additional polymer that is free of an acid-labile sulfonate-ester moiety, wherein the blended polymer combination enhances dissolution contrast of the photoresist.

5. The method of claim 1, wherein the organic solvent comprises a polyhydric alcohol-based positive tone development (PTD) solvent.

6. The method of claim 5, wherein the chemically amplified photoresist is developed with the polyhydric alcohol-based PTD solvent to produce a positive tone image in resist film.

7. The method of claim 5, wherein the polyhydric alcohol-based PTD solvent is ethylene glycol.

8. The method of claim 5, wherein the polyhydric alcohol-based PTD solvent is combined with isopropyl alcohol.

9. The method of claim 1, wherein the organic solvent is an acetate- or ketone-based negative tone development (NTD) solvent.

10. The method of claim 9, wherein the chemically amplified resist is developed with the acetate- or ketone-based NTD to produce a negative tone image in resist film.

11. The method of claim 10, wherein the NTD solvent is selected from the group consisting of methyl amyl ketone (MAK), n-butyl acetate (nBA), n-pentylacetate (nPA), and ethyl amyl ketone (EAK), and combinations thereof.

12. A method comprising the steps of:
    (a) preparing a chemically amplified photoresist composition comprising,
        (i) an organic solvent developable photoresist polymer comprising (A) an acid-labile sulfonate-ester moiety in the range of 1-50 wt %, (B) a repeating unit comprising 2-1',1',1'-trifluoro-2'-(trifluoromethyl)-2'-hydroxy)propyl-norbornyl methacrylate (NB-HFAMA), and (C) an optional repeating unit derived from a hydroxystyrene,
(ii) a casting solvent, and
(iii) an optional photoacid generator (PAG),
(b) applying the resist composition of step (a) to a substrate to form a resist film;
(c) optionally, baking the resist film (PAB);
(d) exposing the resist film to radiation;
(e) optionally, baking the resist film (PEB);
(f) developing the resist film with an organic solvent to expose a pattern etched onto the resist film; and
(g) optionally, rinsing the resist film with water or an organic solvent.

13. The method of claim 12, wherein the photoresist polymer of step (a) comprises a repeating unit derived from a hydroxystyrene.

14. The method of claim 12, wherein the photoresist polymer of step (a) is blended with an additional polymer that is free of an acid-labile sulfonate-ester moiety, wherein the blended polymer combination enhances dissolution contrast of the photoresist.

15. The method of claim 12, wherein the casting solvent of step (a) is selected from the group consisting of propylene glycol methyl ether acetate (PGMEA), cyclohexanone (CHYN), and a combination of PGMEA and CHYN.

16. The method of claim 12, wherein the PAG of step (a) is triphenylsulfonium perfluoro-1-butanesulfonate (TPS-N).

17. The method of claim 12, wherein the radiation of step (d) is selected from the group consisting of deep ultraviolet (DUV) radiation, extreme ultraviolet (EUV) radiation, electron beam (e-beam) radiation, and ion-beam radiation.

18. The method of claim 12, wherein the resist film of step (f) is developed with a positive tone development (PTD) organic solvent to produce a positive tone image on the resist film.

19. The method of claim 18, wherein the PTD organic solvent comprises a polyhydric alcohol-based organic solvent.

20. The method of claim 19, wherein the polyhydric alcohol-based organic solvent is selected from ethylene glycol and ethylene glycol combined with isopropyl alcohol.

21. The method of claim 12, wherein the resist film of step (f) is developed with a negative tone development (NTD) organic solvent to produce a negative tone image on the resist film.

22. The method of claim 21, wherein the NTD organic solvent is selected from the group consisting of a methyl amyl ketone (MAK), n-butyl acetate (nBA), n-pentylacetate (nPA), and ethyl amyl ketone (EAK).

23. The method of claim 12, wherein the resist film of step (f) is a positive tone resist film and is rinsed at step (g) with water.

24. The method of claim 12, wherein the resist film of step (f) is a negative tone resist film and is rinsed at step (g) with an organic solvent.

25. The method of claim 12, wherein the chemically amplified photoresist composition of step (a) further includes a quencher selected from the group consisting of base quenchers and radiation sensitive quenchers.

26. The method of claim 25, wherein the radiation sensitive quencher is a photodecomposable base (PDB).

27. The method of claim 26, wherein the PDB is triphenylsulfonium heptafluorobutyrate (TPS-HFB).

* * * * *